United States Patent
Yang et al.

(10) Patent No.: US 11,386,863 B2
(45) Date of Patent: Jul. 12, 2022

(54) OUTPUT CIRCUIT OF DRIVER

(71) Applicant: NOVATEK Microelectronics Corp., Hsin-Chu (TW)

(72) Inventors: Hsiu-Hui Yang, Hsinchu (TW); Yen-Cheng Cheng, Hsinchu (TW); Chin-Hung Hsu, Taoyuan (TW)

(73) Assignee: NOVATEK Microelectronics Corp., Hsin-Chu (TW)

(*) Notice: Subject to any disclaimer, the term of this patent is extended or adjusted under 35 U.S.C. 154(b) by 0 days.

(21) Appl. No.: 16/513,723

(22) Filed: Jul. 17, 2019

(65) Prior Publication Data
US 2021/0020135 A1 Jan. 21, 2021

(51) Int. Cl.
*G09G 3/36* (2006.01)
*G11C 7/10* (2006.01)

(52) U.S. Cl.
CPC ......... *G09G 3/3685* (2013.01); *G11C 7/1057* (2013.01); *G09G 3/3614* (2013.01); *G09G 3/3688* (2013.01); *G09G 2300/0456* (2013.01); *G09G 2310/027* (2013.01); *G09G 2310/0291* (2013.01); *G09G 2310/0297* (2013.01); *G09G 2330/021* (2013.01)

(58) Field of Classification Search
CPC ......... G09G 3/3865; G09G 2300/0456; G09G 3/3688; G09G 3/3614; G09G 2300/0426; G09G 2310/04; G09G 2310/0297; G09G 2310/0291; G09G 2310/027; G09G 2310/0221; G09G 2310/0218; G09G 2310/0213; G11C 7/1057
See application file for complete search history.

(56) References Cited

U.S. PATENT DOCUMENTS

| | | | | |
|---|---|---|---|---|
| 7,511,691 B2* | 3/2009 | Hirayama | ............ | G09G 3/3677 345/88 |
| 8,427,461 B2* | 4/2013 | Lin | ....... | G09G 3/3688 345/55 |
| 10,204,589 B2* | 2/2019 | Kim | ....... | G09G 3/3688 |
| 10,943,556 B2* | 3/2021 | Chen | ........ | G09G 3/3685 |
| 2003/0071779 A1* | 4/2003 | Lee | ....... | G09G 3/3688 345/99 |
| 2004/0125067 A1* | 7/2004 | Kim | ....... | G09G 3/3696 345/98 |
| 2008/0158131 A1* | 7/2008 | Park | ....... | G09G 3/3688 345/98 |

(Continued)

FOREIGN PATENT DOCUMENTS

| | | |
|---|---|---|
| CN | 1412737 A | 4/2003 |
| CN | 1432989 A | 7/2003 |

(Continued)

*Primary Examiner* — Mihir K Rayan
(74) *Attorney, Agent, or Firm* — Winston Hsu

(57) ABSTRACT

An output circuit of a driver includes a plurality of output nodes, a first output buffer group and a multiplexer. The first output buffer group is configured to output data to the plurality of output nodes, wherein each output buffer in the first output buffer group is configured to output data to at least two output nodes among the plurality of output nodes. The multiplexer, coupled between the plurality of output nodes and the first output buffer group, is configured to select to couple each output buffer in the first output buffer group to one of the plurality of output nodes.

8 Claims, 30 Drawing Sheets

(56) References Cited

U.S. PATENT DOCUMENTS

| | | | |
|---|---|---|---|
| 2008/0259016 A1* | 10/2008 | Tanaka | G09G 3/3688 345/90 |
| 2010/0164913 A1* | 7/2010 | Lin | G09G 3/3688 345/205 |
| 2010/0225570 A1* | 9/2010 | Liu | G09G 3/3614 345/87 |
| 2011/0032240 A1* | 2/2011 | Wang | H03F 1/0205 345/212 |
| 2011/0102471 A1* | 5/2011 | Hsu | G09G 3/3607 345/87 |
| 2011/0134093 A1* | 6/2011 | Chen | G09G 3/3696 345/211 |
| 2013/0235007 A1* | 9/2013 | Yen | G09G 3/36 345/204 |
| 2016/0098951 A1* | 4/2016 | Kim | G09G 3/3688 345/209 |
| 2016/0111055 A1* | 4/2016 | Na | G09G 3/3666 345/212 |

FOREIGN PATENT DOCUMENTS

| | | |
|---|---|---|
| CN | 1641728 A | 7/2005 |
| CN | 1773600 A | 5/2006 |
| CN | 101866590 A | 10/2010 |
| CN | 103310745 A | 9/2013 |
| CN | 105489149 A | 4/2016 |
| CN | 105719606 A | 6/2016 |
| CN | 106205449 A | 12/2016 |
| JP | 2005-257710 A | 9/2005 |
| KR | 10-2017-0015726 A | 2/2017 |
| TW | 201011717 A1 | 3/2010 |
| TW | 201523557 A | 6/2015 |
| WO | 2010/030097 A2 | 3/2010 |

* cited by examiner

OUTPUT CIRCUIT OF DRIVER

BACKGROUND OF THE INVENTION

1. Field of the Invention

The present invention relates to an output circuit of a driver, and more particularly, to an output circuit of a source driver for a panel.

2. Description of the Prior Art

The liquid crystal display (LCD), which has advantages of thin appearance, low power saving and low radiation, etc. has widely been applied in various electronic products such as a computer screen, mobile telephone, personal digital assistant (PDA), flat television, and other communication/entertainment equipment. The principle of LCD is to vary the twisted angle of liquid crystal molecules in a liquid crystal layer by varying the voltage difference between two terminals of the liquid crystal layer. The transparency of the liquid crystal layer may change accordingly, which is further incorporated with the light source provided by a backlight module to display images.

The LCD includes a driver chip, in which a source driver is configured to drive the data lines on the LCD to change their voltage levels, so as to control the liquid crystal molecules in the liquid crystal layer to display desired images on the LCD panel. In the LCD system, most power consumption originates from charging of the data lines, and the related output buffers in the source driver used for driving the data lines consume a large amount of static power. Due to requirements of low power consumption in modern electronic products, various techniques have been developed to reduce power consumption of the driver chip, especially the source driver. However, the conventional power reduction techniques are usually accompanied by degraded image quality and/or display performance. Thus, there is a need to provide a novel source driver structure, so as to improve the power consumption performance while maintaining the display performance of the LCD.

SUMMARY OF THE INVENTION

It is therefore an objective of the present invention to provide an output circuit of the source driver, which is capable of improving the power consumption performance of the source driver without degrading the display performance of the panel.

An embodiment of the present invention discloses an output circuit of a driver. The output circuit comprises a plurality of output nodes, a first output buffer group and a multiplexer. The first output buffer group is configured to output data to the plurality of output nodes, wherein each output buffer in the first output buffer group is configured to output data to at least two output nodes among the plurality of output nodes. The multiplexer, coupled between the plurality of output nodes and the first output buffer group, is configured to select to couple each output buffer in the first output buffer group to one of the plurality of output nodes.

Another embodiment of the present invention discloses an output circuit of a driver. The output circuit comprises a plurality of output nodes, a first output buffer and a multiplexer. The first output buffer is configured to output data to the plurality of output nodes. The multiplexer, coupled between the plurality of output nodes and the first output buffer, is configured to select to couple the first output buffer to one of the plurality of output nodes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
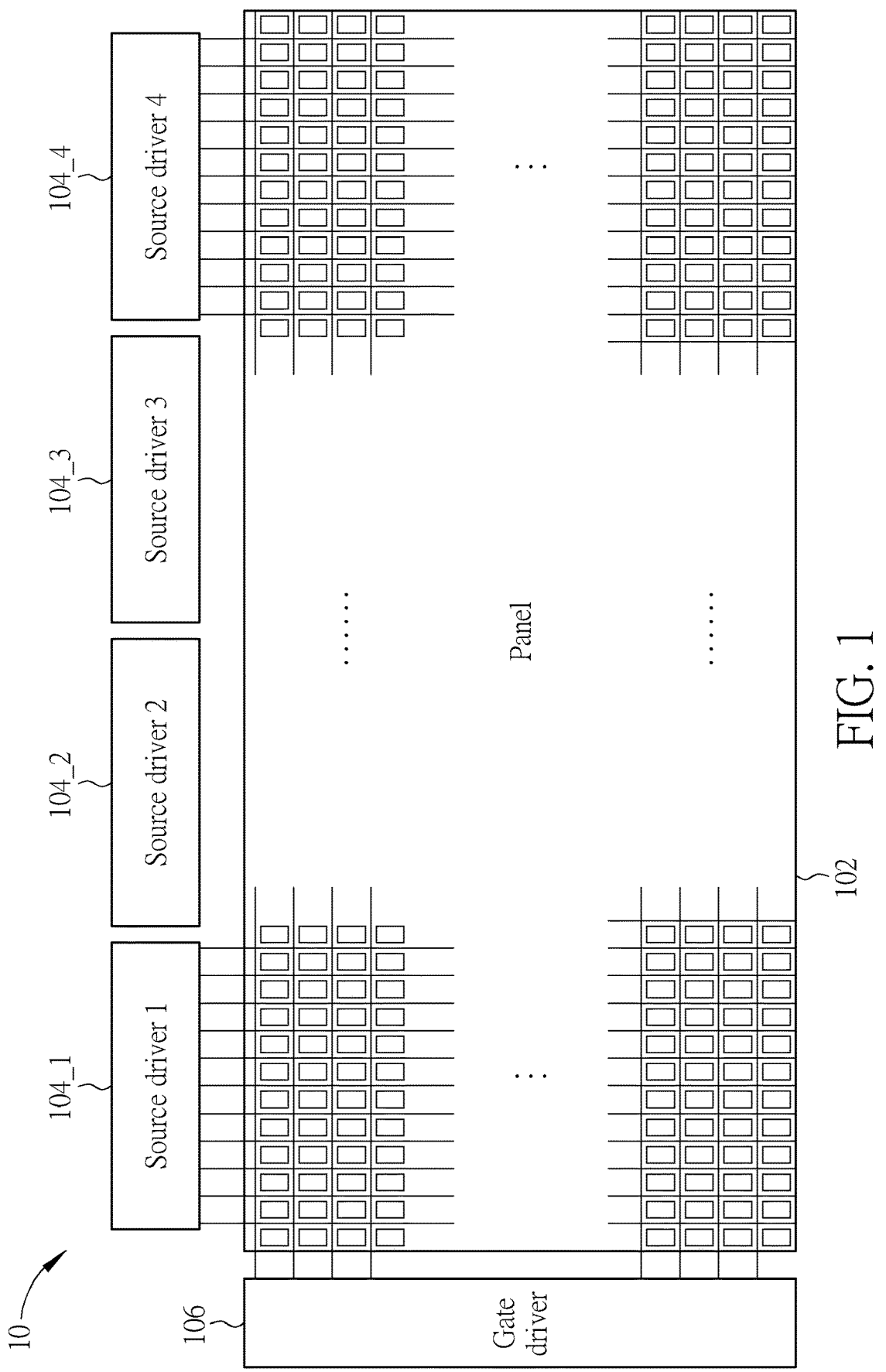
FIG. 1 is a schematic diagram of a general display system.

Please refer to FIG. 1, which is a schematic diagram of a general display system 10. The display system 10 includes a panel 102, at least one source driver 104_1-104_4, and a gate driver 106. The panel 102 includes a subpixel array, where each subpixel receives voltage data from the corresponding source driver based on a control signal from the gate driver 106. In general, the display system 10 may include any number of source driver (s) based on the panel size and resolution, and four source drivers 104_1-104_4 are illustrated in FIG. 1 as an example. In an embodiment, the gate driver 106 may be implemented on the glass substrate of the panel 106, as a gate-on-array (GOA) structure.

Figure 2:
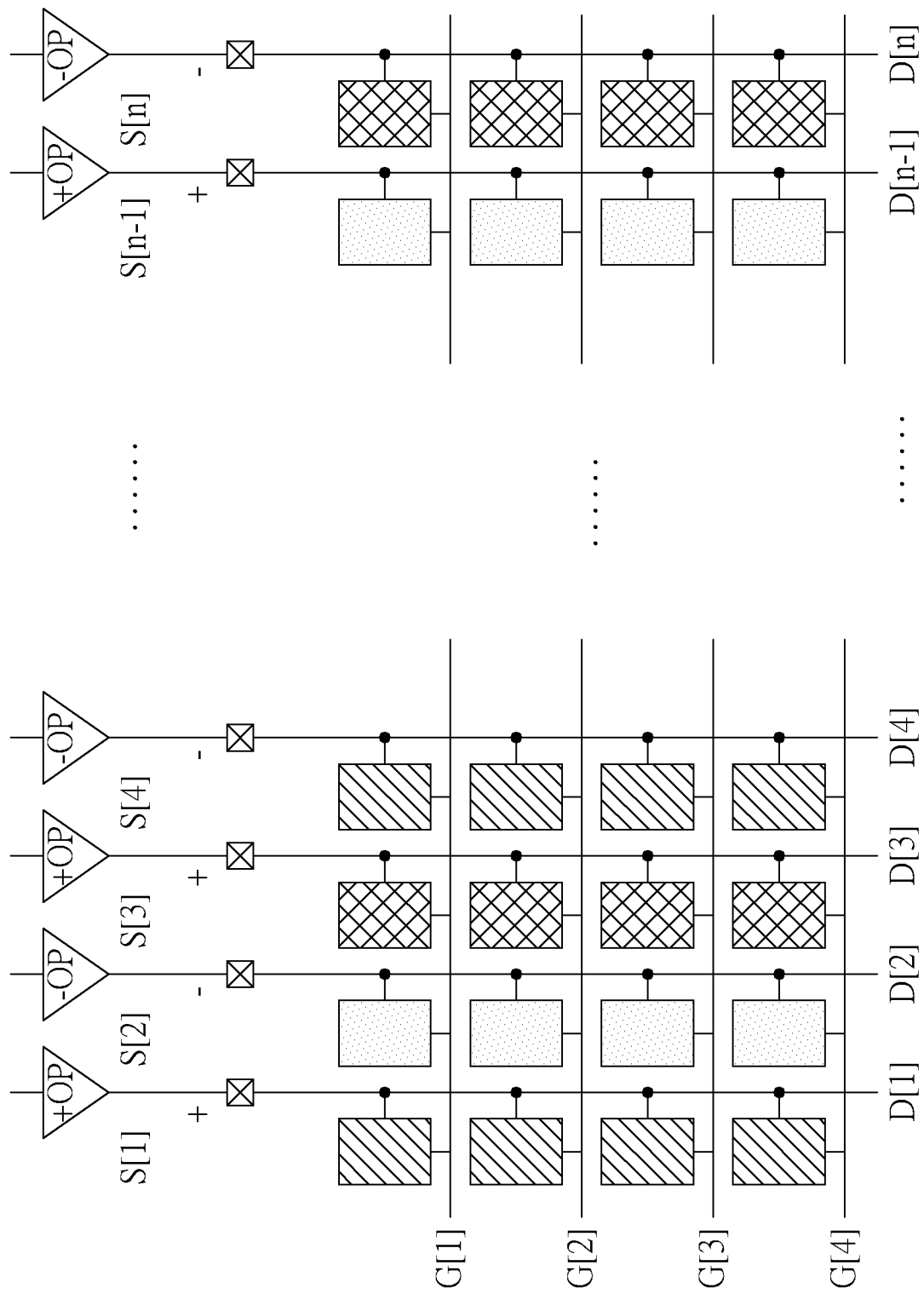
FIG. 2 illustrates a detailed structure of the display system shown in FIG. 1.

FIG. 2 illustrates a detailed structure of the display system 10. Each subpixel is connected to the gate driver 106 via gate lines G[1], G[2], . . . , respectively, and connected to a source driver via data lines D[1], D[2], . . . , D[n], respectively. Each data line D[1]-D[n] is connected to and driven by an operational amplifier (OP) of an output channel, respectively. In other words, each OP is configured to drive a column of subpixels through a corresponding data line. In general, the OPs have basic static power consumption. With requirements of higher resolution and increasing number of subpixels in the panel 102, more OPs are necessary to support the increasing number of subpixel columns; hence, the static power consumption will become an important issue to be considered in the display system 10.

In order to reduce total power consumption, it is preferable to reduce the number of OPs in the source driver. Therefore, the present invention provides a source driver in which one OP is capable of driving at least two output channels, or a group of OPs is capable of driving a number of output channels more than the number of OPs in the group. As a result, the total OP count in the display system may be reduced, which thereby reduces the circuit costs and the static power consumption of the display system.

Figure 3:
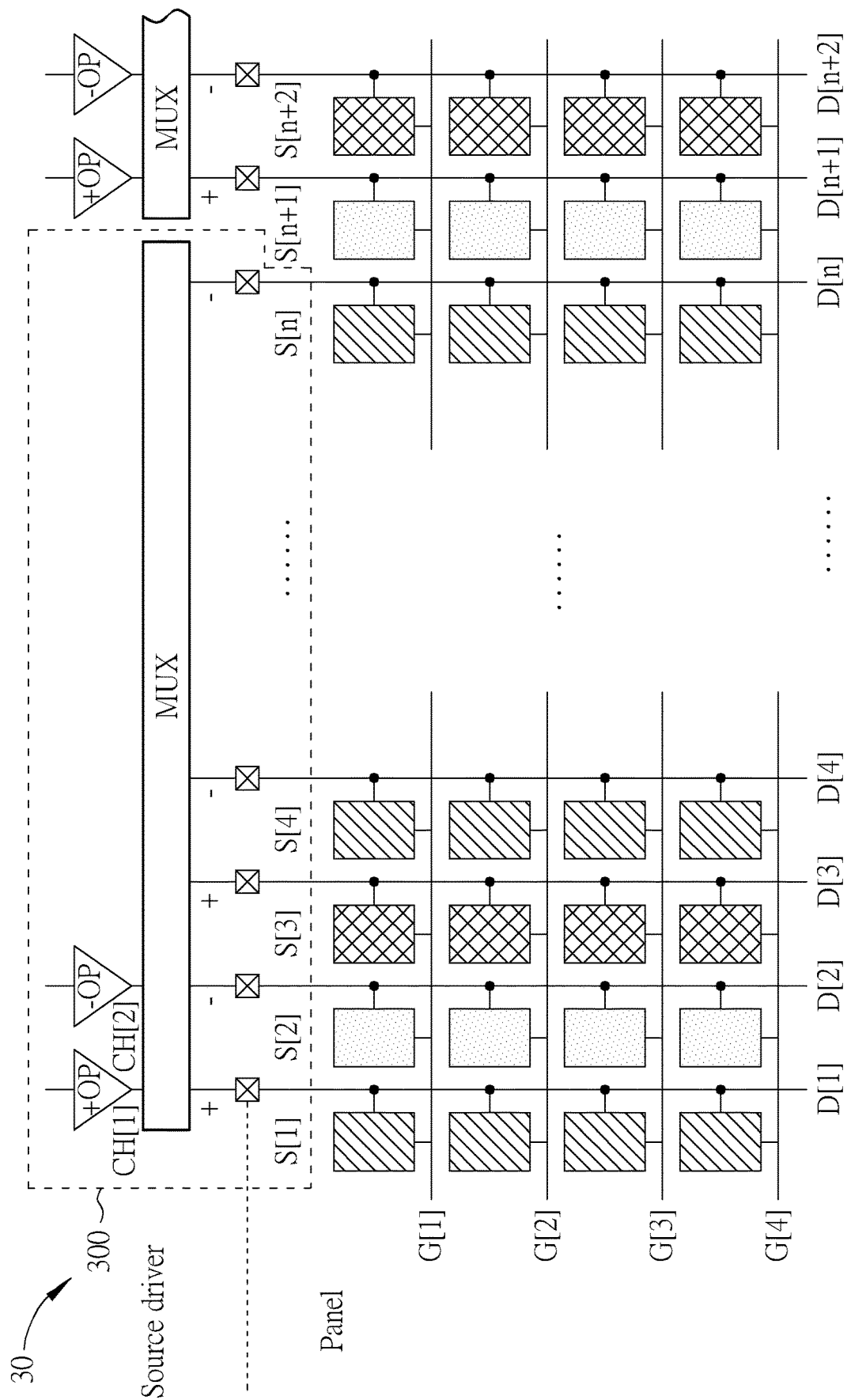
FIG. 3 is a schematic diagram of a display system according to an embodiment of the present invention.

Please refer to FIG. 3, which is a schematic diagram of a display system 30 according to an embodiment of the present invention. As shown in FIG. 3, the display system 30 includes a panel, a source driver, and a gate driver (not illustrated). For the sake of simplicity, only a part of the panel and a corresponding output circuit 300 of the source driver are illustrated in FIG. 3. The output circuit 300 includes output nodes S[1]-S[n], an output buffer group and a multiplexer (MUX). The output nodes S[1]-S[n] refer to nodes or terminals for connecting the source driver with the panel, and may be output pins of the chip or integrated circuit (IC) in which the source driver is implemented. The output buffer group includes several output buffers, and an OP may be served as an output buffer for outputting image data to the output nodes S[1]-S[n] and the panel. In this embodiment, the output buffer group includes an OP with positive polarity (+OP) and an OP with negative polarity (−OP), for outputting image data having positive polarity and negative polarity, respectively. The MUX is coupled between the output nodes S[1]-S[n] and the output buffer group. The MUX may select to couple each OP in the output buffer group to one of the output nodes S[1]-S[n], allowing the OPs to output image data to the corresponding data lines. With time division control of the MUX, each OP is able to output image data to different data lines via the corresponding output nodes.

Figure 4:
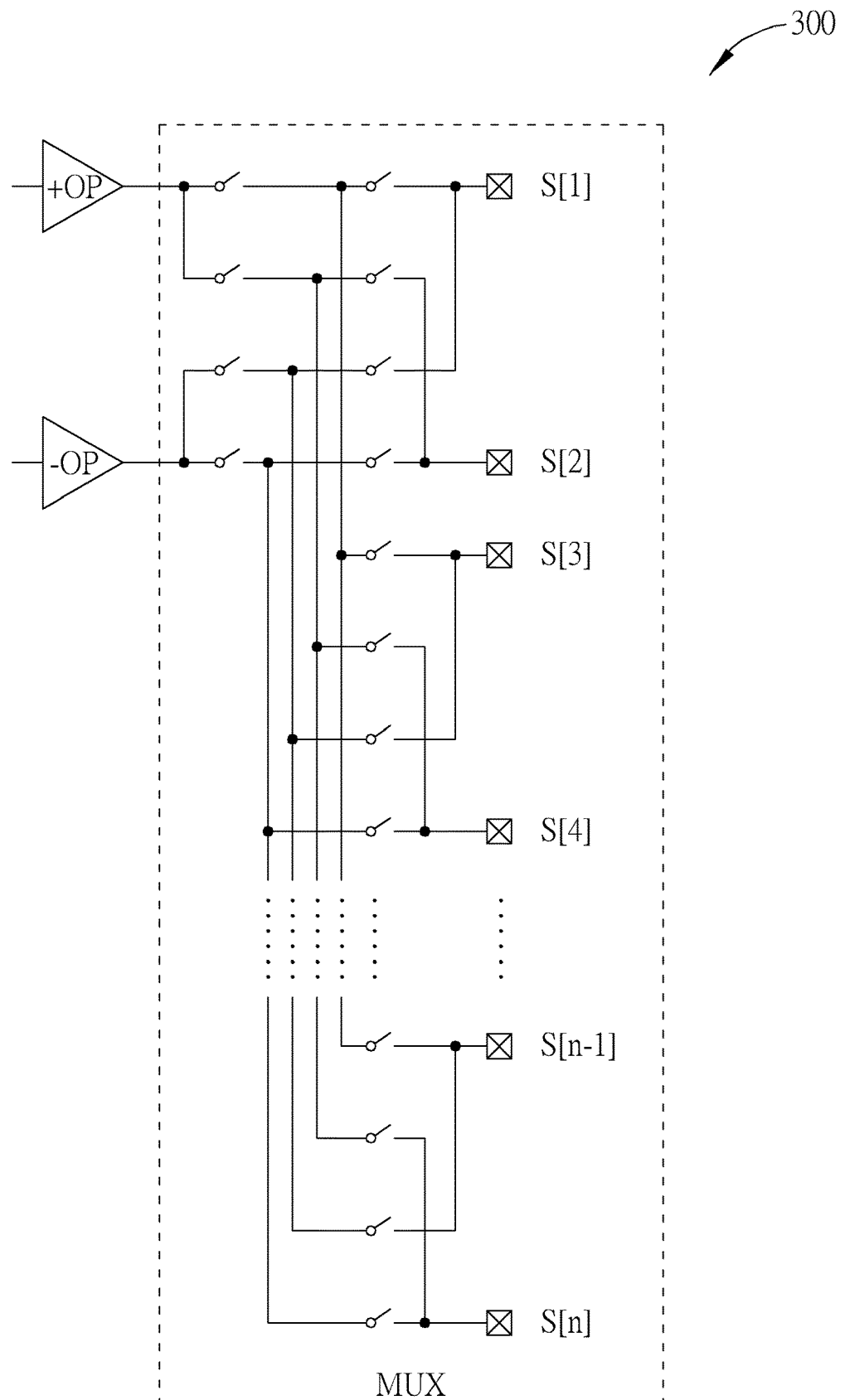
FIG. 4 illustrates the output circuit with a detailed structure of the multiplexer (MUX).

FIG. 4 illustrates the output circuit 300 with a detailed structure of the MUX. In order to allow two OPs to output image data to n output nodes S[1]-S[n], where n is greater than 2, the MUX may include a plurality of switches. The configuration of the switches may control each OP to be coupled to one output node in a data cycle. Different configurations allow each of the OPs to be coupled to different output nodes in different data cycles.

Figure 5:
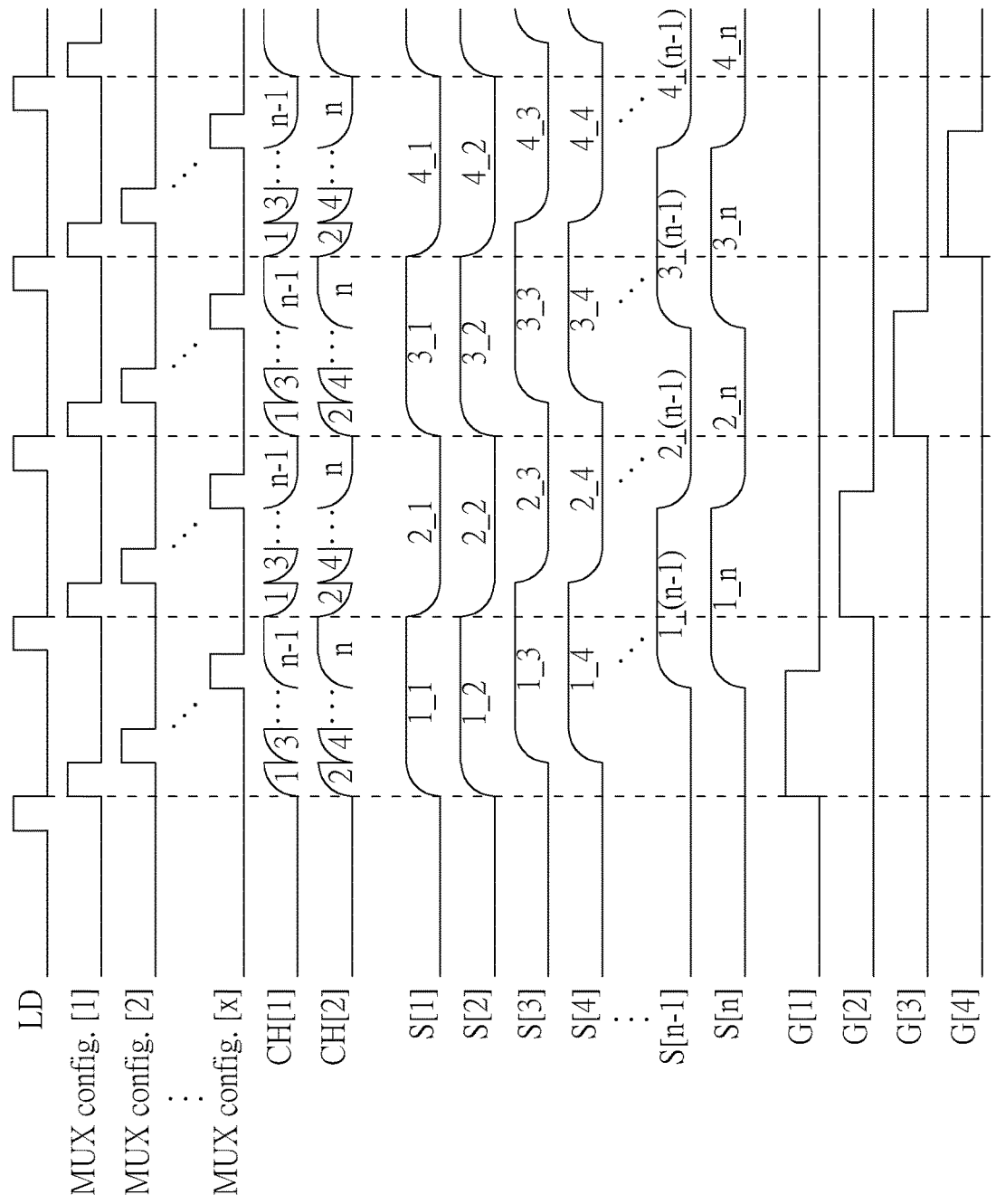
FIG. 5 is a waveform diagram of the display system shown in FIG. 3.

Please refer to FIG. 5, which is a waveform diagram of the display system 30. FIG. 5 illustrates the waveforms of channels CH[1] and CH[2] (which respectively correspond to +OP and −OP in the output buffer group), the output nodes S[1]-S[n] and the gate lines G[1]-G[4], and related control signals LD and MUX configurations. Each gate line G[1]-G[4] is turned on in turn upon receiving the LD signal from the timing controller. In the first data cycle, the MUX configuration controls the OPs to be connected to the output nodes S[1] and S[2], and thus the image data are forwarded to subpixels 1_1 and 1_2 from the channels CH[1] and CH[2] via the MUX and the output nodes S[1] and S[2]. In the next data cycle, the MUX configuration controls the OPs to be connected to the output nodes S[3] and S[4], and thus the image data are forwarded to subpixels 1_3 and 1_4 from the channels CH[1] and CH[2] via the MUX and the output nodes S[3] and S[4]. By the same token, in the last data cycle of the gate line G[1], the MUX configuration controls the OPs to be connected to the output nodes S[n−1] and S[n], and thus the image data are forwarded to subpixels 1_(n−1) and 1_n from the channels CH[1] and CH[2] via the MUX and the output nodes S[n−1] and S[n]. Therefore, every n subpixels in the first row may receive image data from two OPs. After the first row of subpixels receive corresponding image data, the first gate line G[1] may be turned off. Subsequently, the gate lines G[2], G[3] and G[4] are turned on in turn, and the MUX and OPs perform similar operations to output image data to the $2^{nd}$, $3^{rd}$ and $4^{th}$ rows of subpixels.

In the display system 10, each column of subpixels is driven by a respective OP. In comparison, in the display system 30 having the MUX, an OP may be used to drive multiple columns of subpixels; hence, the total OP count in the display system 30 is significantly reduced, which reduces the static power consumption required by the OPs.

Figure 6A:
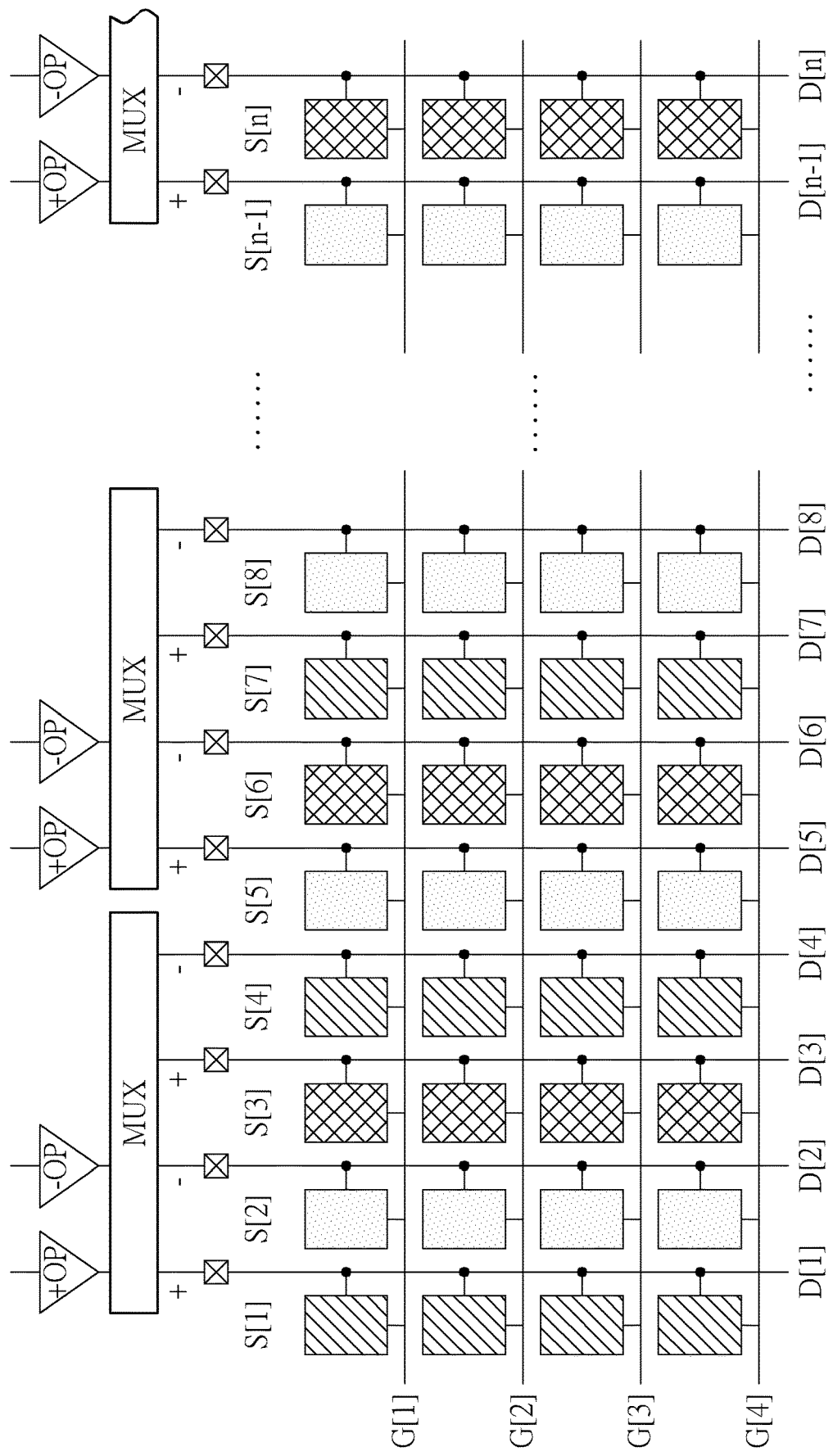
FIGS. 6A-6C are schematic diagrams of an output buffer group having two operational amplifiers configured to drive four data lines via four output nodes.
Figure 6B:
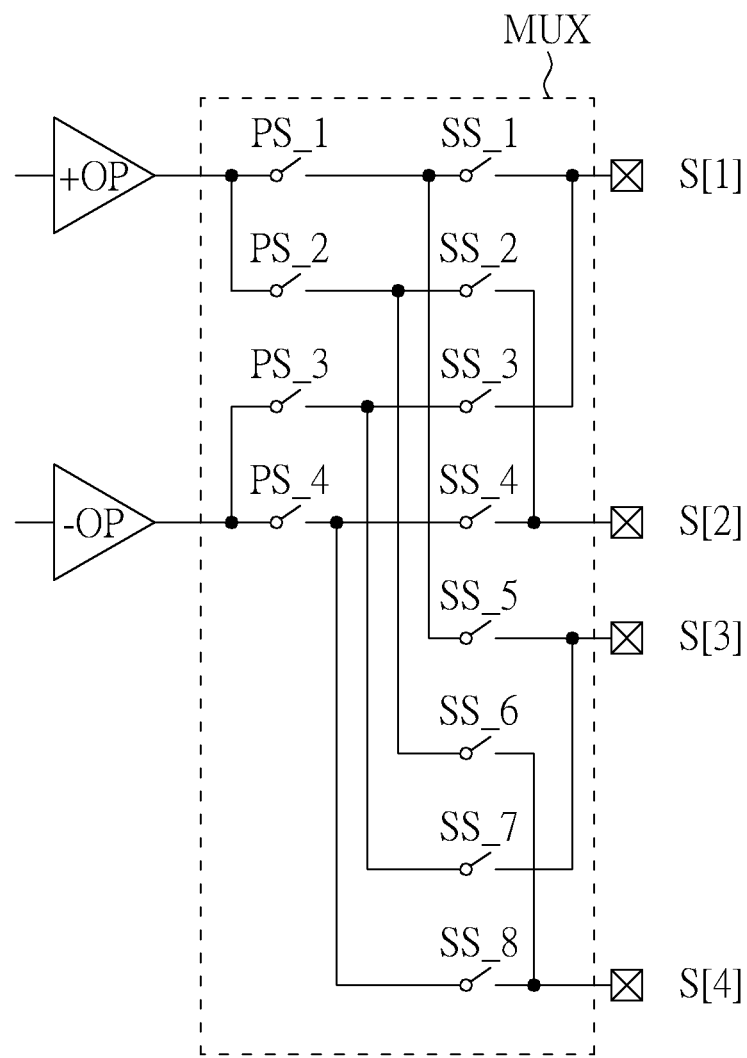
Figure 6C:
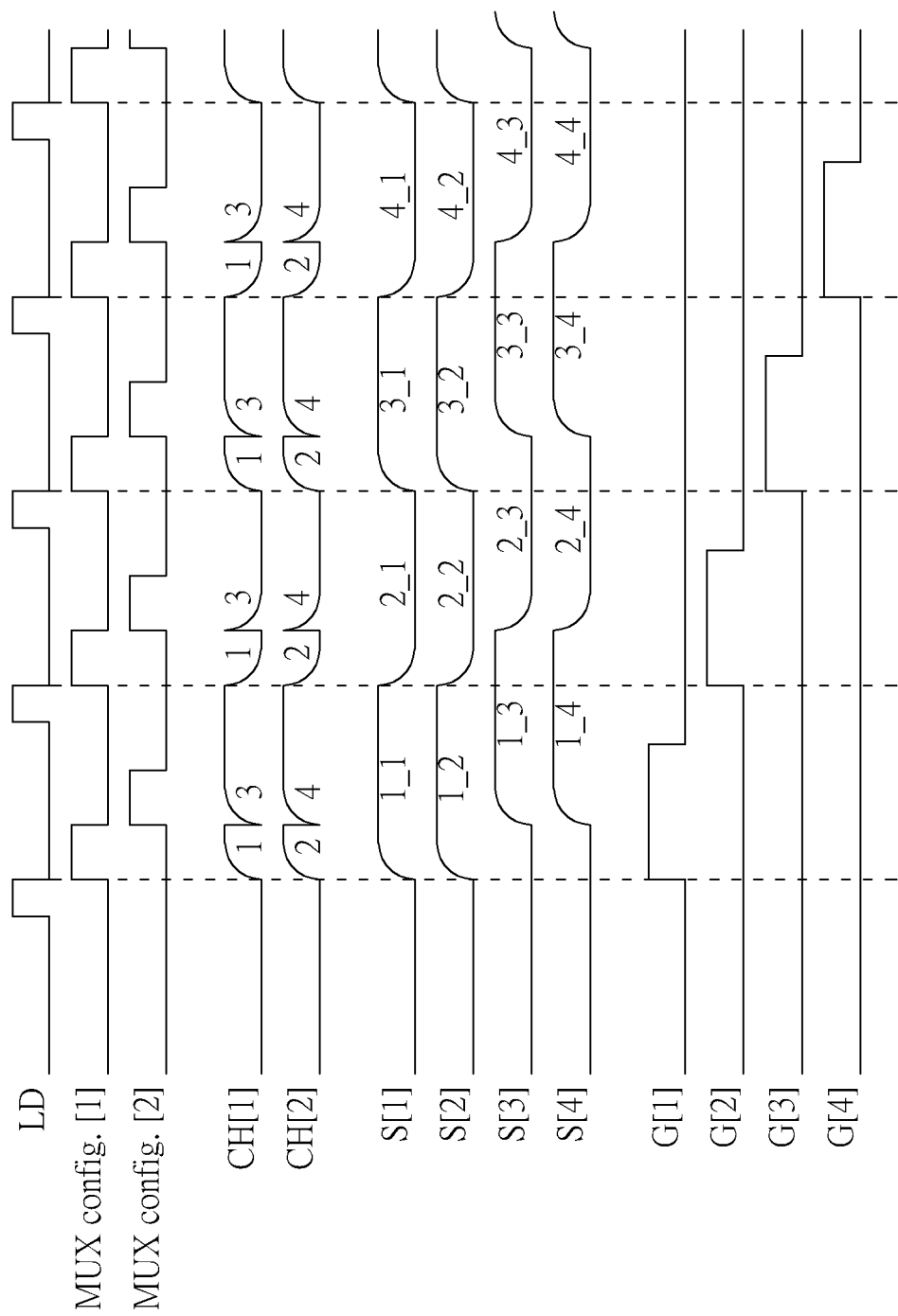

For the sake of simplicity, an embodiment where an output buffer group having two OPs is configured to drive four data lines via four output nodes is described as follows, as shown in FIGS. 6A, 6B and 6C. FIG. 6A illustrates the structure of the output circuit of the source driver where the output buffer group having two OPs may be connected to four output nodes and configured to drive four columns of subpixels. FIG. 6B illustrates the output circuit with the detailed structure of the MUX. FIG. 6C illustrates a related waveform diagram. As shown in FIG. 6A, every four columns of subpixels share two OPs (including an OP with positive polarity and an OP with negative polarity), so that the OP count in the source driver may be reduced by half in comparison with the general source driver 10 as shown in FIG. 1. As shown in FIG. 6B, the two OPs (i.e., the output buffer group) include an OP (+OP) configured to output image data in positive polarity and an OP (−OP) configured to output image data in negative polarity. The implementation of the MUX allows the OPs to be selected to drive the data lines and subpixels coupled to the output nodes S[1] and S[2] or drive the data lines and subpixels coupled to the output nodes S[3] and S[4] while providing the function of polarity inversion.

In detail, the MUX may include a plurality of switches coupled between the output buffer group and one of the output nodes S[1]-S[4]. These switches may be classified into polarity swapping switches PS_1-PS_4 and selection switches SS_1-SS_8, as shown in FIG. 6B. The selection switches SS_1-SS_8 control the OPs in the output buffer group to be coupled to the output nodes S[1], S[2] or S[3], S[4], and the polarity swapping switches PS_1-PS_4 control the polarities of image data for each data line.

Figure 7A:
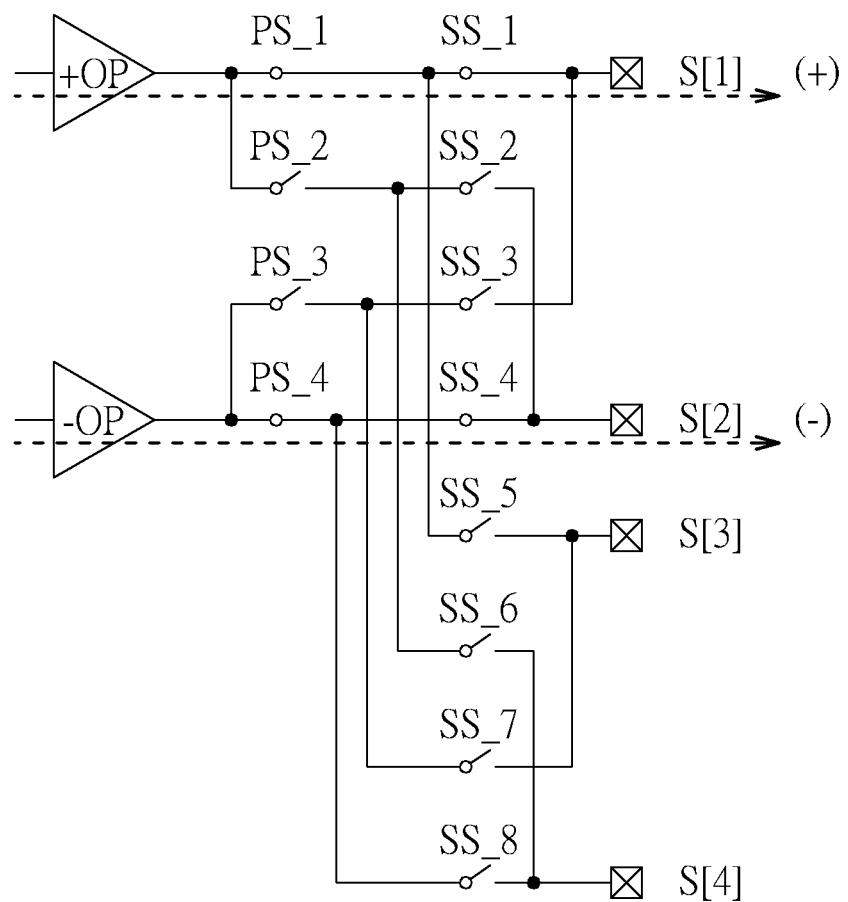
FIGS. 7A-7D are the operations of the MUX and related data flows.
Figure 7B:
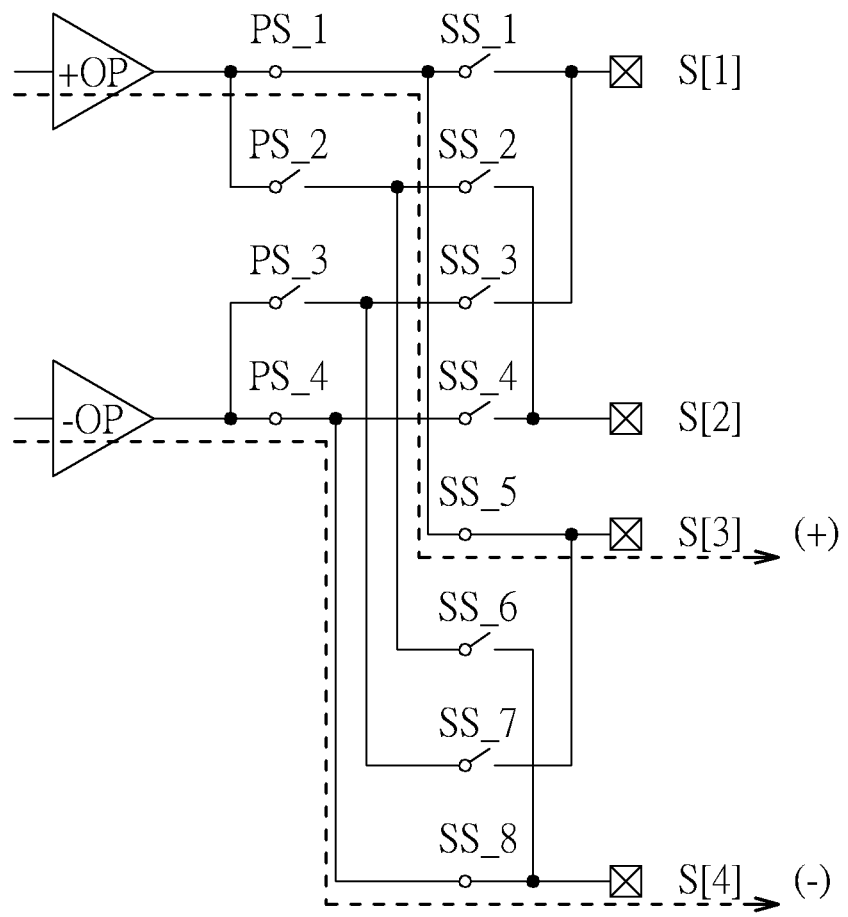

The output circuit may operate in a polarity non-swapping mode and a polarity swapping mode alternately. For example, with a frame inversion scheme, the operation mode of polarity changes frame by frame; with a row inversion scheme, the operation mode of polarity changes row by row. FIG. 7A illustrates the operations of the MUX and related data flows in the first data cycle of the polarity non-swapping mode. As shown in FIG. 7A, in this data cycle, the switches PS_1, PS_4, SS_1 and SS_4 are turned on, and other switches are turned off. Therefore, the output buffer group is coupled to the output nodes S[1] and S[2]. More specifically, the OP with positive polarity is coupled to the output node S[1] and the OP with negative polarity is coupled to the output node S[2]; hence, the image data having positive polarity is forwarded to the output node S[1] and the image data having negative polarity is forwarded to the output node S[2]. Subsequently, the configurations of the MUX change in the next data cycle. FIG. 7B illustrates the operations of the MUX and related data flows in the next data cycle of the polarity non-swapping mode. As shown in FIG. 7B, in this data cycle, the switches PS_1, PS_4, SS_5 and SS_8 are turned on, and other switches are turned off. Therefore, the output buffer group is coupled to the output nodes S[3] and S[4]. More specifically, the OP with positive polarity is coupled to the output node S[3] and the OP with negative polarity is coupled to the output node S[4]; hence, the image data having positive polarity is forwarded to the output node S[3] and the image data having negative polarity is forwarded to the output node S[4].

Figure 7C:
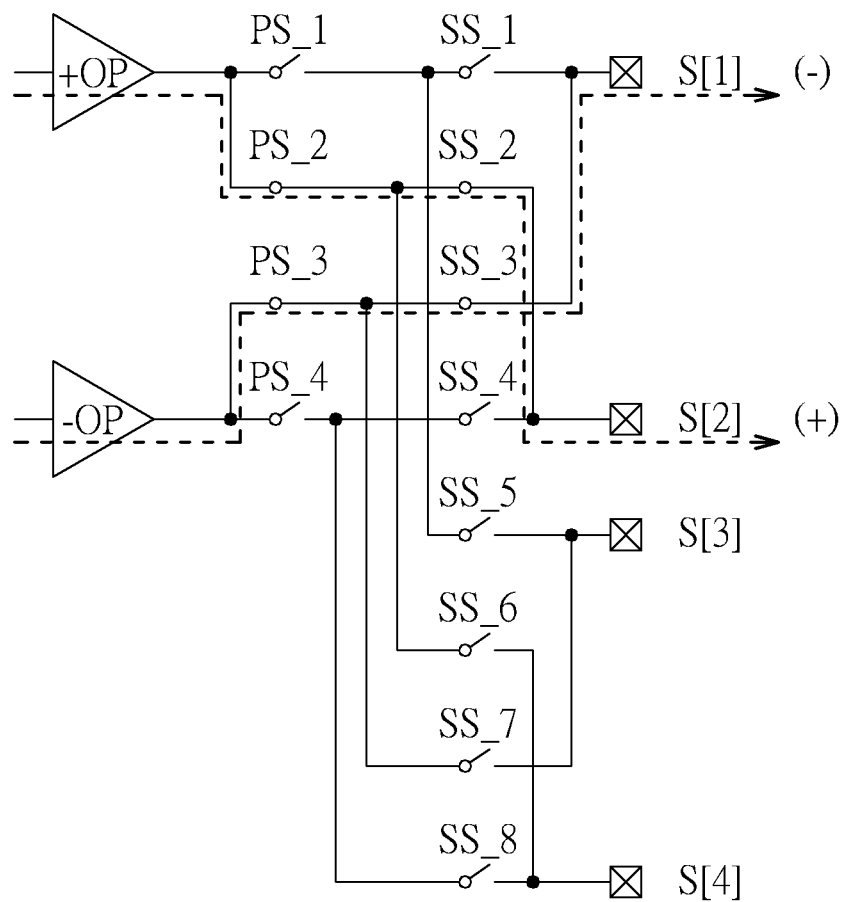
Figure 7D:
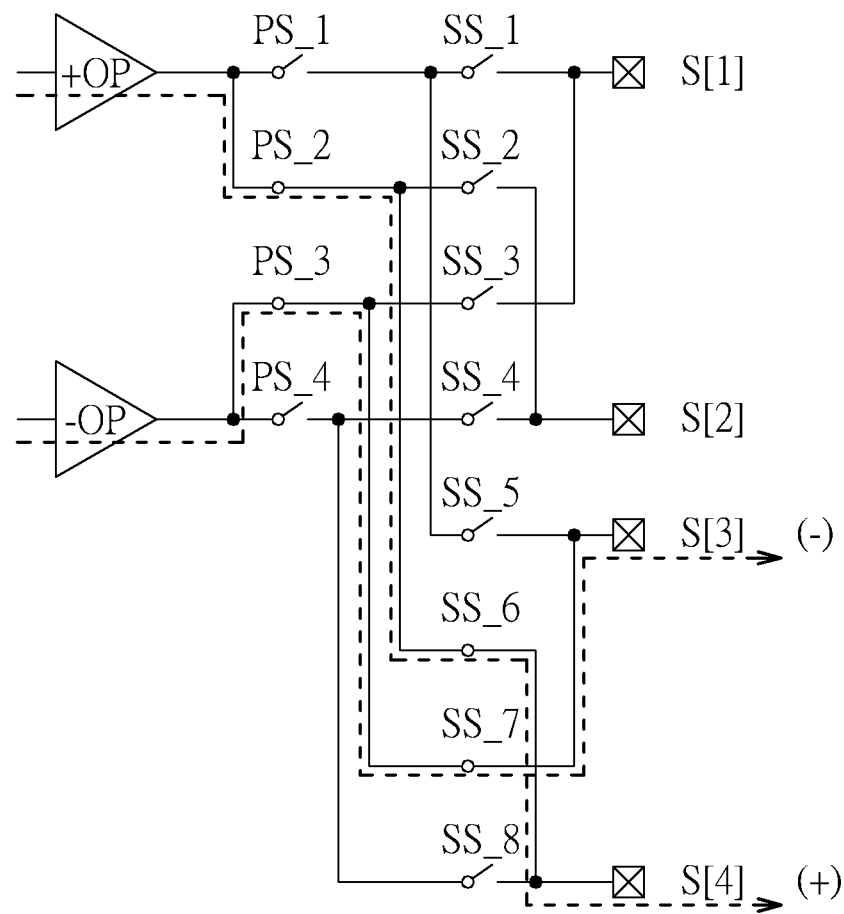

The operation mode of polarity is controlled by the polarity swapping switches PS_1-PS_4. As mentioned above, the polarity swapping switches PS_1 and PS_4 are turned on when the source driver operates in the polarity non-swapping mode. When the source driver operates in the polarity swapping mode, the polarity swapping switches PS_1 and PS_4 may be turned off and the polarity swapping switches PS_2 and PS_3 may be turned on to realize polarity inversion. FIG. 7C illustrates the operations of the MUX and related data flows in the first data cycle of the polarity swapping mode. As shown in FIG. 7C, in this data cycle, the switches PS_2, PS_3, SS_2 and SS_3 are turned on, and other switches are turned off. Therefore, the output buffer group is coupled to the output nodes S[1] and S[2]. More specifically, the OP with positive polarity is coupled to the output node S[2] and the OP with negative polarity is coupled to the output node S[1]; hence, the image data having positive polarity is forwarded to the output node S[2] and the image data having negative polarity is forwarded to the output node S[1]. Subsequently, the configurations of the MUX change in the next data cycle. FIG. 7D illustrates the operations of the MUX and related data flows in the next data cycle of the polarity swapping mode. As shown in FIG. 7D, in this data cycle, the switches PS_2, PS_3, SS_6 and SS_7 are turned on, and other switches are turned off. Therefore, the output buffer group is coupled to the output nodes S[3] and S[4]. More specifically, the OP with positive polarity is coupled to the output node S[4] and the OP with negative polarity is coupled to the output node S[3]; hence, the image data having positive polarity is forwarded to the output node S[4] and the image data having negative polarity is forwarded to the output node S[3].

Figure 8:
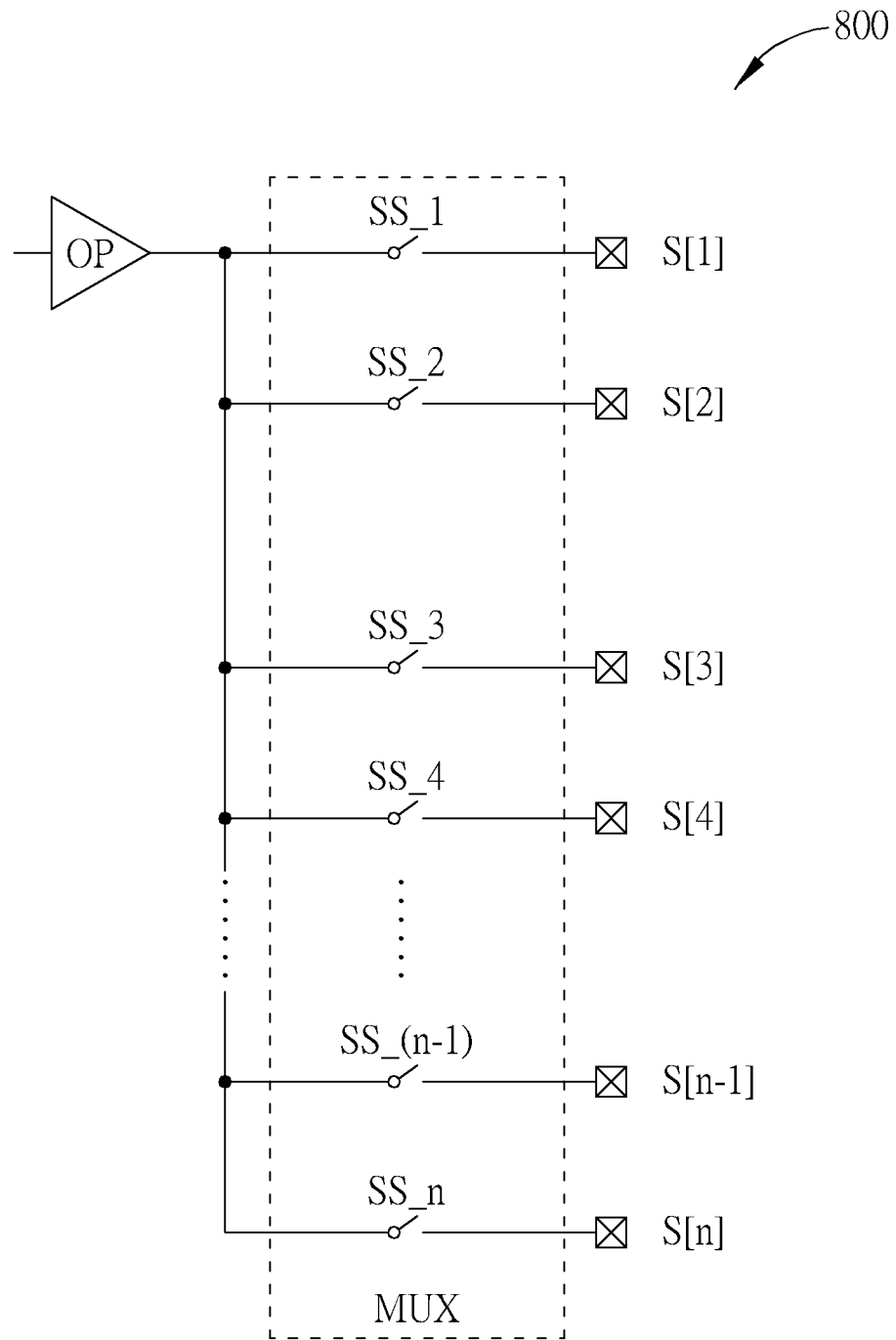
FIG. 8 is a schematic diagram of another output circuit according to an embodiment of the present invention.

In an embodiment, the output circuit may be implemented without consideration of polarity inversion; that is, every image data outputted by the output circuit may have the same polarity. In such a situation, an output buffer group may include only one OP, which is capable of driving multiple data lines and output corresponding image data to multiple output nodes. Please refer to FIG. 8, which is a schematic diagram of another output circuit 800 according to an embodiment of the present invention. As shown in FIG. 8, the output buffer group includes only one OP served as the output buffer. The MUX includes selection switches SS_1-SS_n, configured to select to couple the OP to one of the output nodes S[1]-S[n]. The detailed operations and implementations related to the output circuit 300 are also applicable to the output circuit 800, except that the polarity inversion operations and the polarity swapping switches PS_1-PS_4 are not required in the output circuit 800.

Please note that polarity inversion is a common driving method for liquid crystal display (LCD) panels. The polarity inversion scheme allows each subpixel in the LCD panel to be driven with positive polarity and negative polarity alternately, so as to prevent image sticking after long-term driving of the same polarity. Thus, the output circuit 300 in which the output buffer group has an OP with positive polarity (+OP) and an OP with negative polarity (−OP) may be applicable to the source driver for the LCD panel, in order to realize the polarity inversion and output channel selection. On the other hand, as for another type of panel such as an organic light-emitting diode (OLED) panel, the polarity inversion technique is not required; hence, the output circuit 800 without polarity inversion functionality is feasible to this type of panel. As long as an output buffer of the output circuit is capable of driving multiple data lines and/or a specific number of output buffers are capable of outputting image data to more number of output nodes, the driving method should belong to the scope of the present invention.

It should also be noted that the present invention aims at providing an output circuit of a source driver capable of driving the data lines of the panel by using less number of output buffers. Those skilled in the art may make modifications and alternations accordingly. For example, the above structure of the MUX is merely one of various implementations of the present invention. In fact, the MUX may be realized in any feasible manner.

Figure 9:
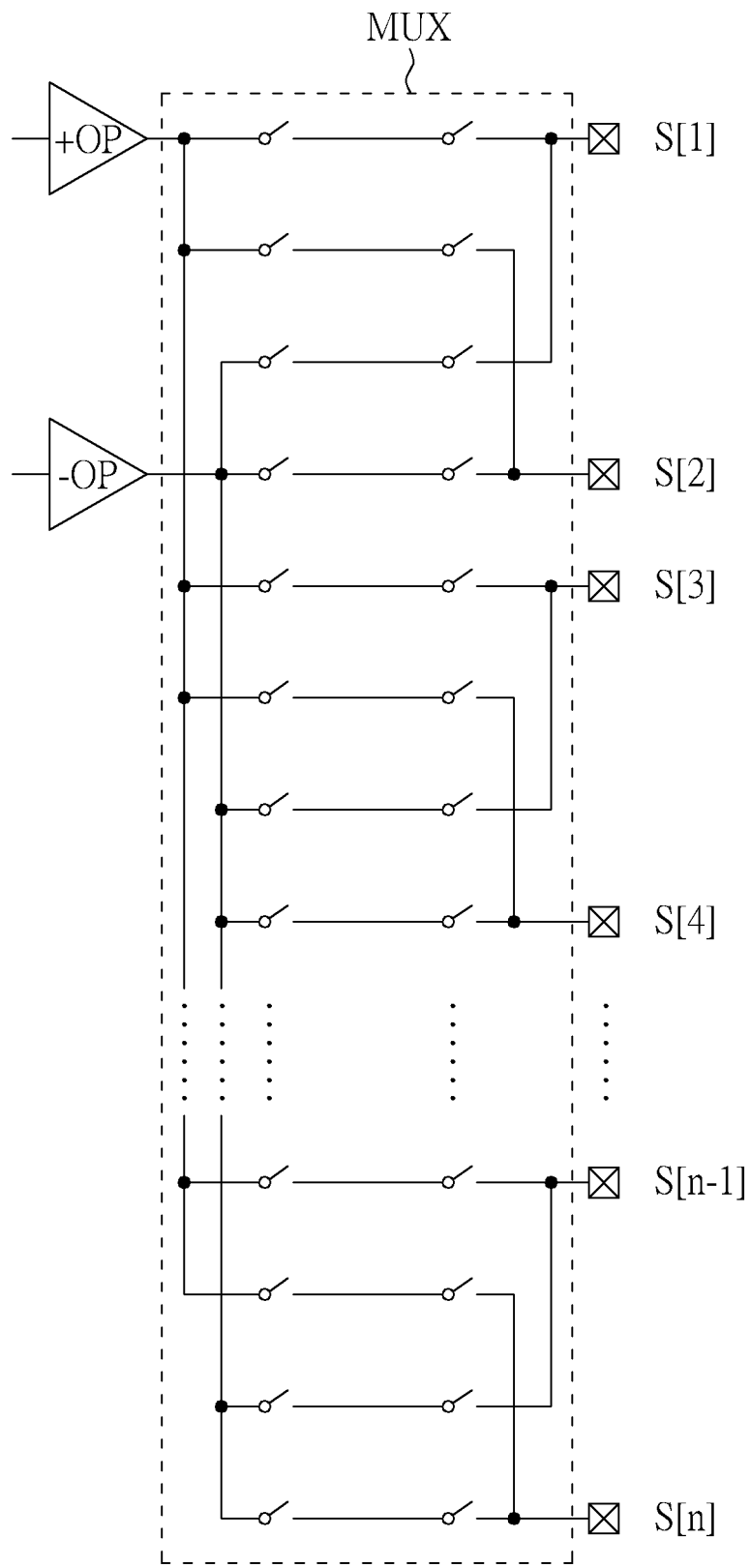
FIGS. 9 and 10 are schematic diagrams of an output circuit having different structures of MUX according to embodiments of the present invention.

Please refer to FIG. 9, which is a schematic diagram of an output circuit 900 according to an embodiment of the present invention. The structure of the output circuit 900 is similar to the structure of the output circuit 300 as shown in FIG. 4, except that the MUX in the output circuit 900 has more number of polarity swapping switches. In the MUX of the output circuit 900, the number of the polarity swapping switches is equal to the number of selection switches, and the polarity swapping switches are connected to the selection switches in a one-on-one manner; that is, each polarity swapping switch is mapped to a selection switch. Each OP is connected to a selected output node if the corresponding selection switch and the mapping polarity swapping switch are both turned on.

Figure 10:
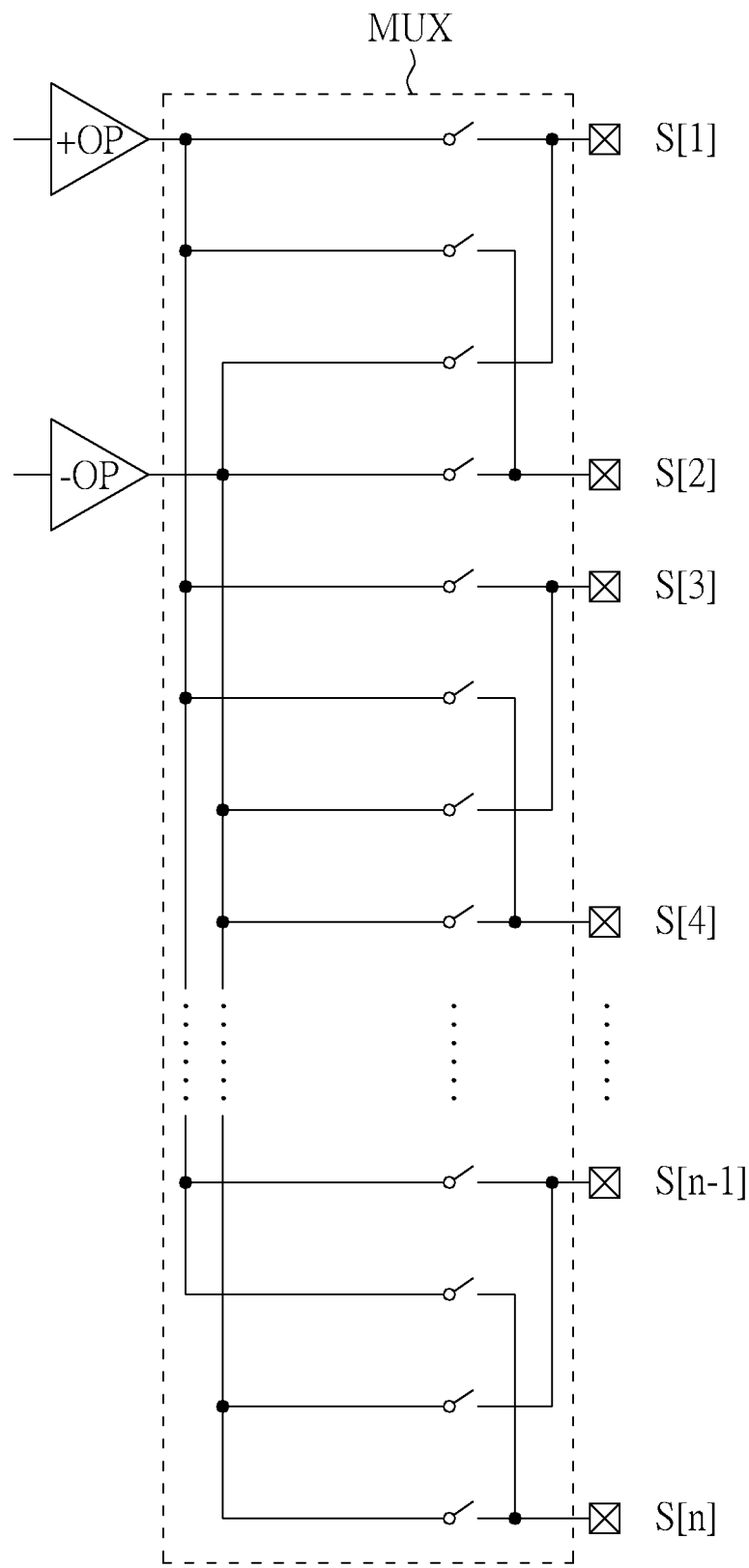

Since each polarity swapping switch is mapped to a selection switch with a one-on-one mapping, each polarity swapping switch may be integrated with the corresponding selection switch, to form a single switch in each output channel, as shown in FIG. 10. Each OP is connected to a selected output node if the corresponding switch is turned on.

As mentioned above, each output buffer is capable of driving multiple data lines of the panel, so that the data lines may be driven by using less number of output buffers, so as to reduce the number of output buffers in the source driver and thereby reduce the power consumption. As shown in FIGS. 5 and 6C, a turned-on cycle of each gate line is shared by multiple data cycles for multiple data lines driven by an output buffer. For example, if an output buffer is configured to drive two data lines, the driving time for a data line is equal to a half of the turned-on cycle of a gate line. If an output buffer is configured to drive n data lines, the driving time for a data line is equal to 1/n of the turned-on cycle of a gate line. This may result in insufficient charging time for the data lines. In order to solve this problem, the power saving operation where one output buffer is configured to drive multiple data lines may be selectively performed.

Figure 11:
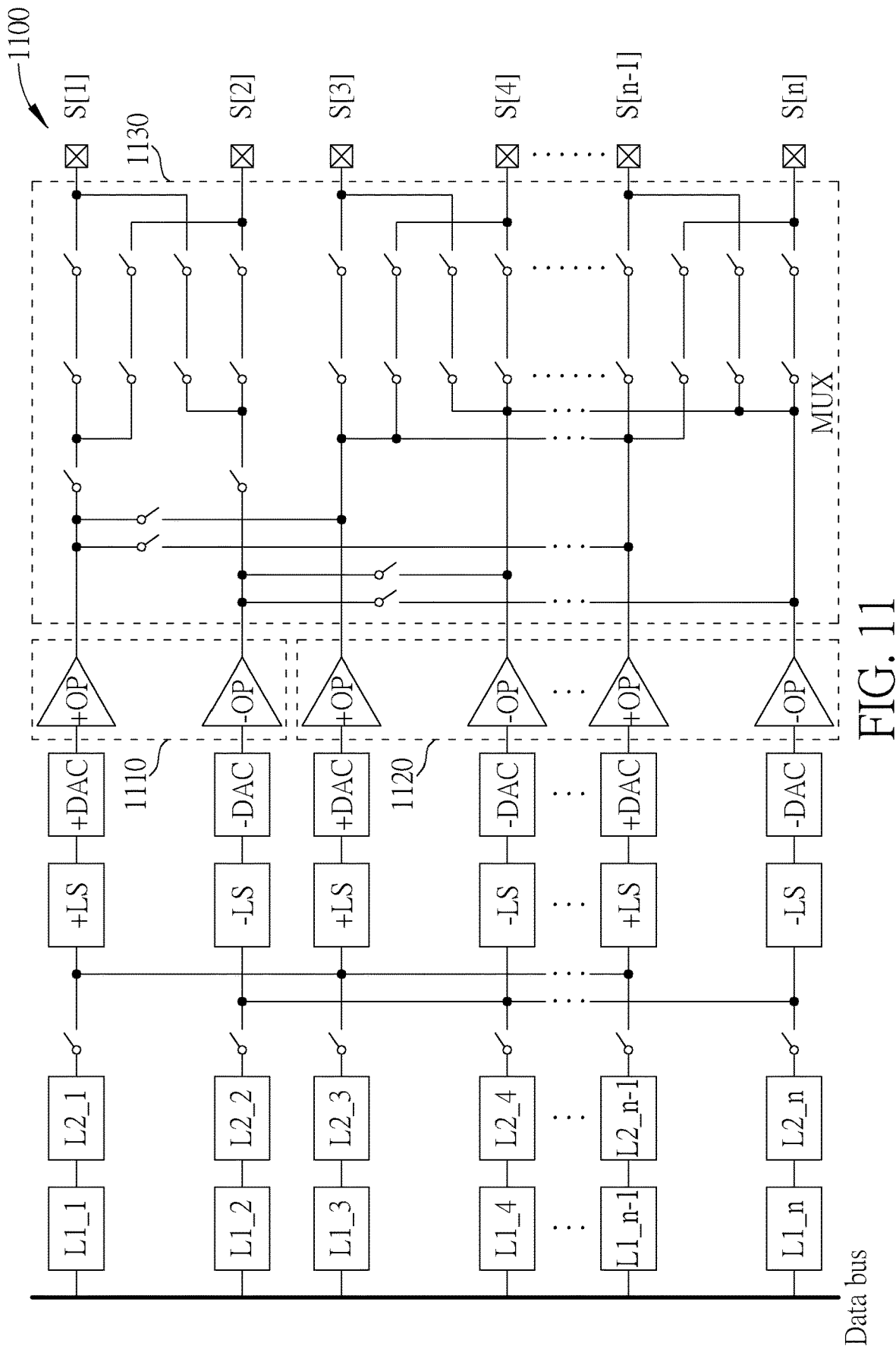
FIG. 11 is a schematic diagram of a source driver according to an embodiment of the present invention.

Please refer to FIG. 11, which is a schematic diagram of a source driver 1100 according to an embodiment of the present invention. The source driver 1100 includes an output circuit, which includes a first output buffer group 1110, a second output buffer group 1120, a MUX 1130 and output nodes S[1]-S[n]. The first output buffer group 1110 includes an OP with positive polarity and an OP with negative polarity, and other OPs are classified into the second output buffer group 1120. Each output buffer (e.g., each OP) may be configured to drive a corresponding data line and output image data to a corresponding output node in a one-on-one mapping, and coupled to and receives image data from an input channel. The input channel includes a first data latch (L1_1-L1_n), a second data latch (L2_1-L2_n), a level shifter (+LS with positive polarity or −LS with negative polarity), and a digital to analog converter (+DAC with positive polarity or −DAC with negative polarity). The MUX 1130 includes a plurality of switches, allowing each output node S[1]-S[n] to receive image data from a corresponding output buffer or an output buffer in the first output buffer group 1110. In each input channel, a switch is disposed between the second data latch (L2_1-L2_n) and the level shifter (+LS, −LS), and thus each output buffer may receive image data from selected data latches based on control of the switches.

Figure 12A:
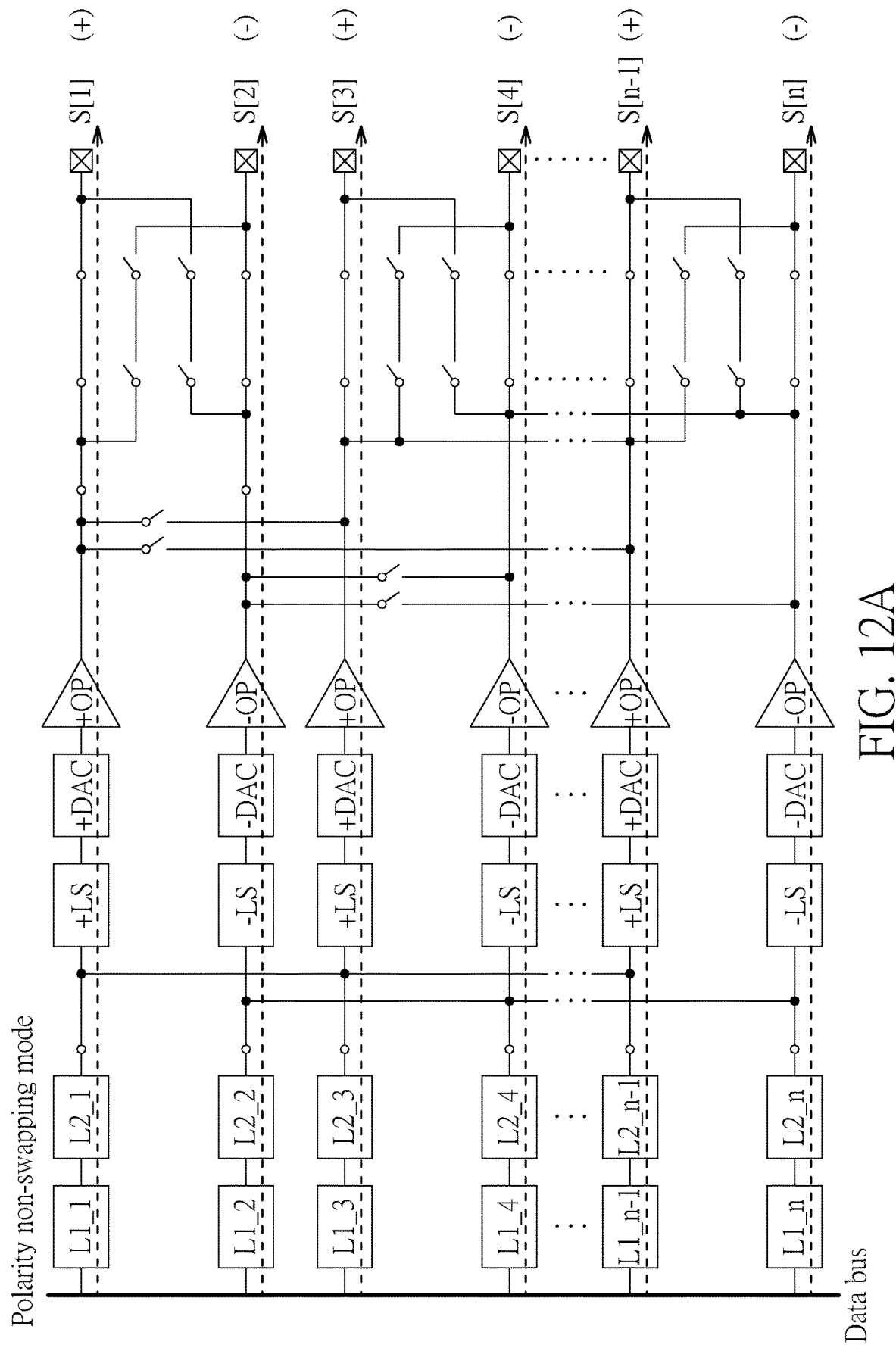
FIGS. 12A and 12B are schematic diagrams of the operations of the MUX and related data flows of the source driver in the normal mode.
Figure 12B:
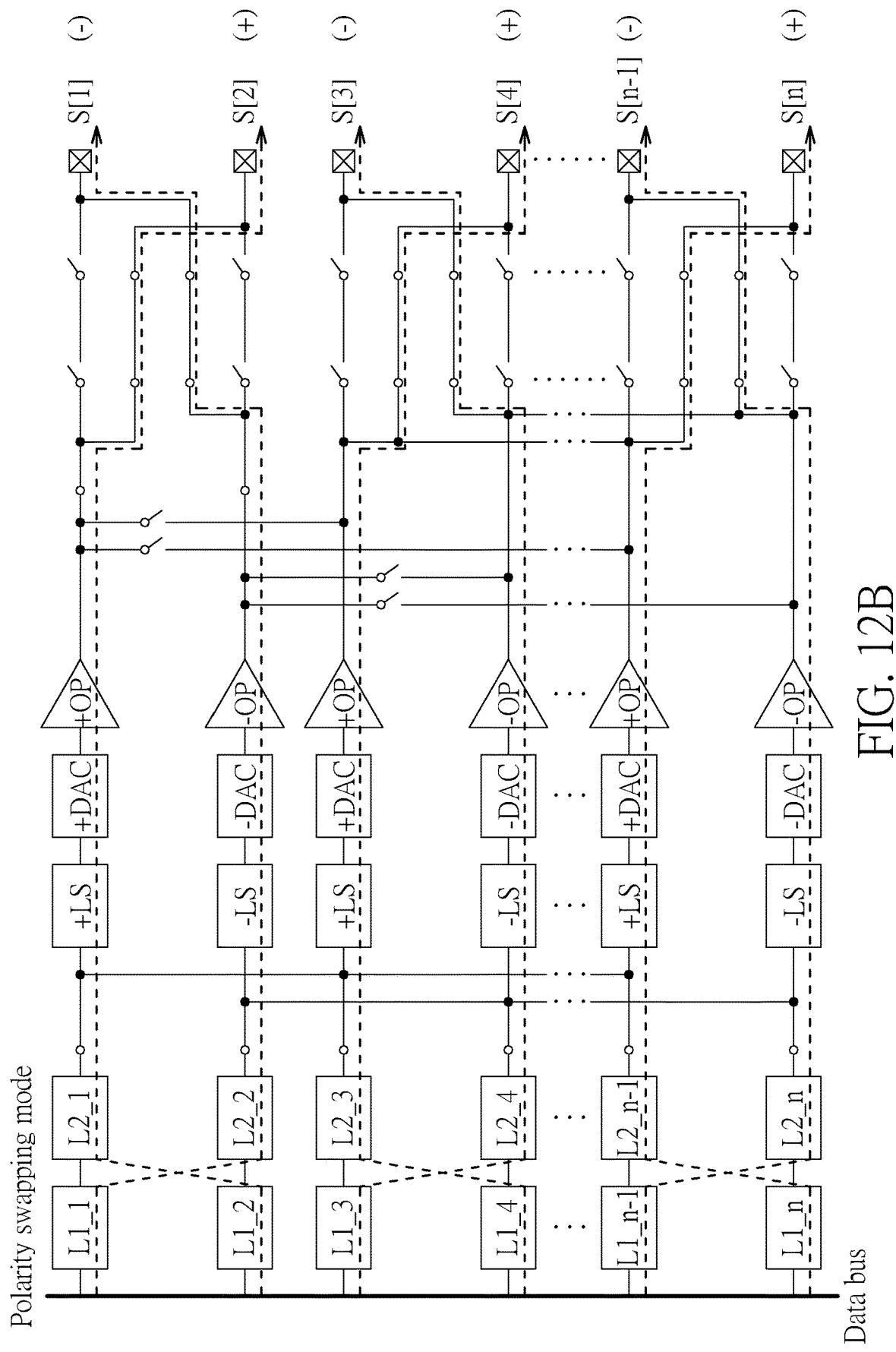

In detail, the source driver 1100 may be selected to operate in a power saving mode or a normal mode. In the normal mode, both the first output buffer group 1110 and the second output buffer group 1120 output image data to the output nodes S[1]-S[n]. The MUX 1130 is configured so that each output node S[1]-S[n] receives image data from a corresponding channel and output buffer. FIGS. 12A and 12B illustrate the operations of the MUX and related data flows of the source driver 1100 in the normal mode, where all OPs in the source driver 1100 operate to output image data to the corresponding output node. FIG. 12A illustrates the data flows in the polarity non-swapping mode and FIG. 12B illustrates the data flows in the polarity swapping mode. Note that there may be a connection between the second data latch and the first data latch in two adjacent input channels (not illustrated), so as to realize the polarity swapping operation.

Figure 13A:
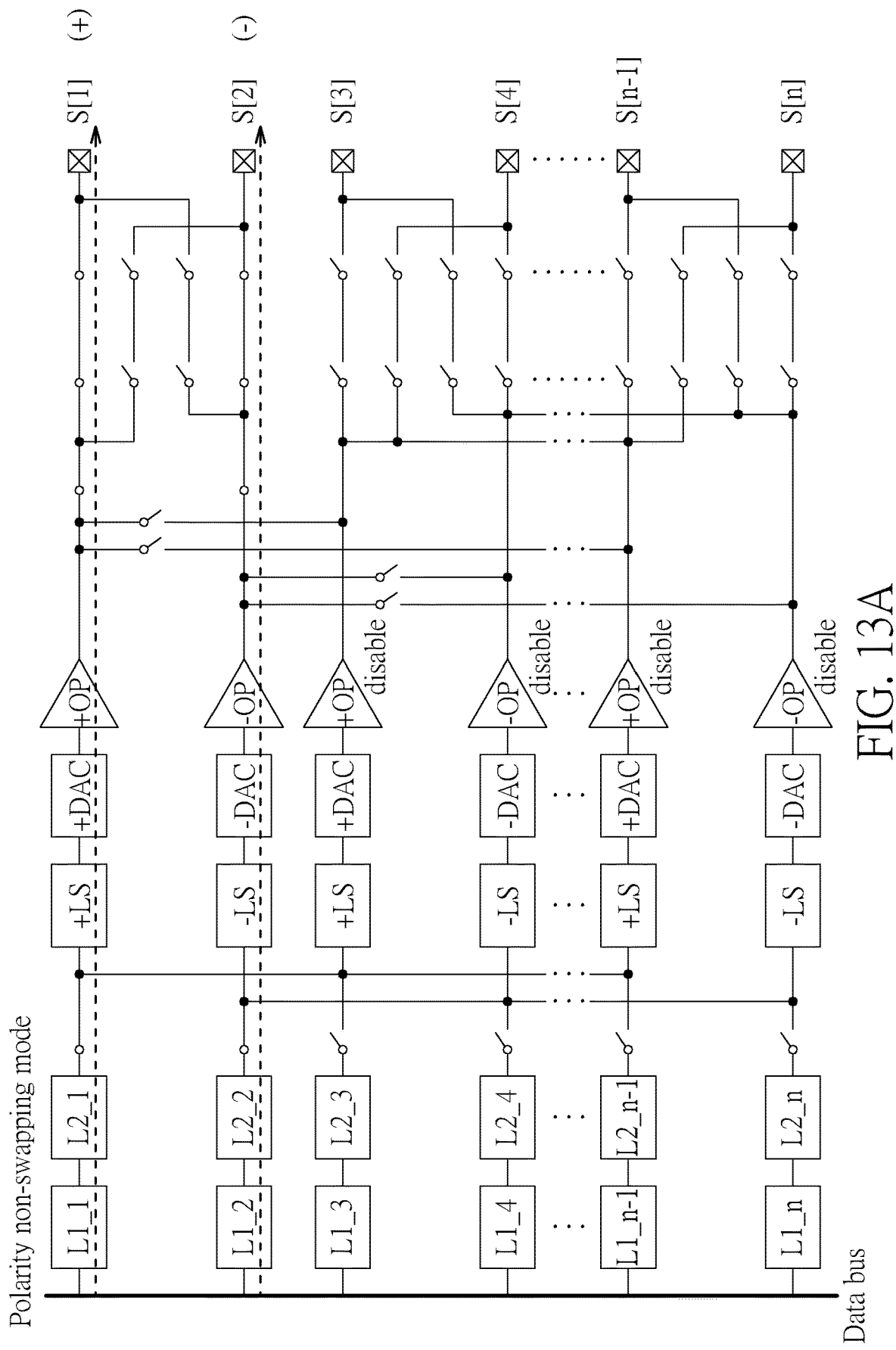
FIGS. 13A-13F are schematic diagrams of the operations of the MUX and related data flows of the source driver in the power saving mode.
Figure 13B:
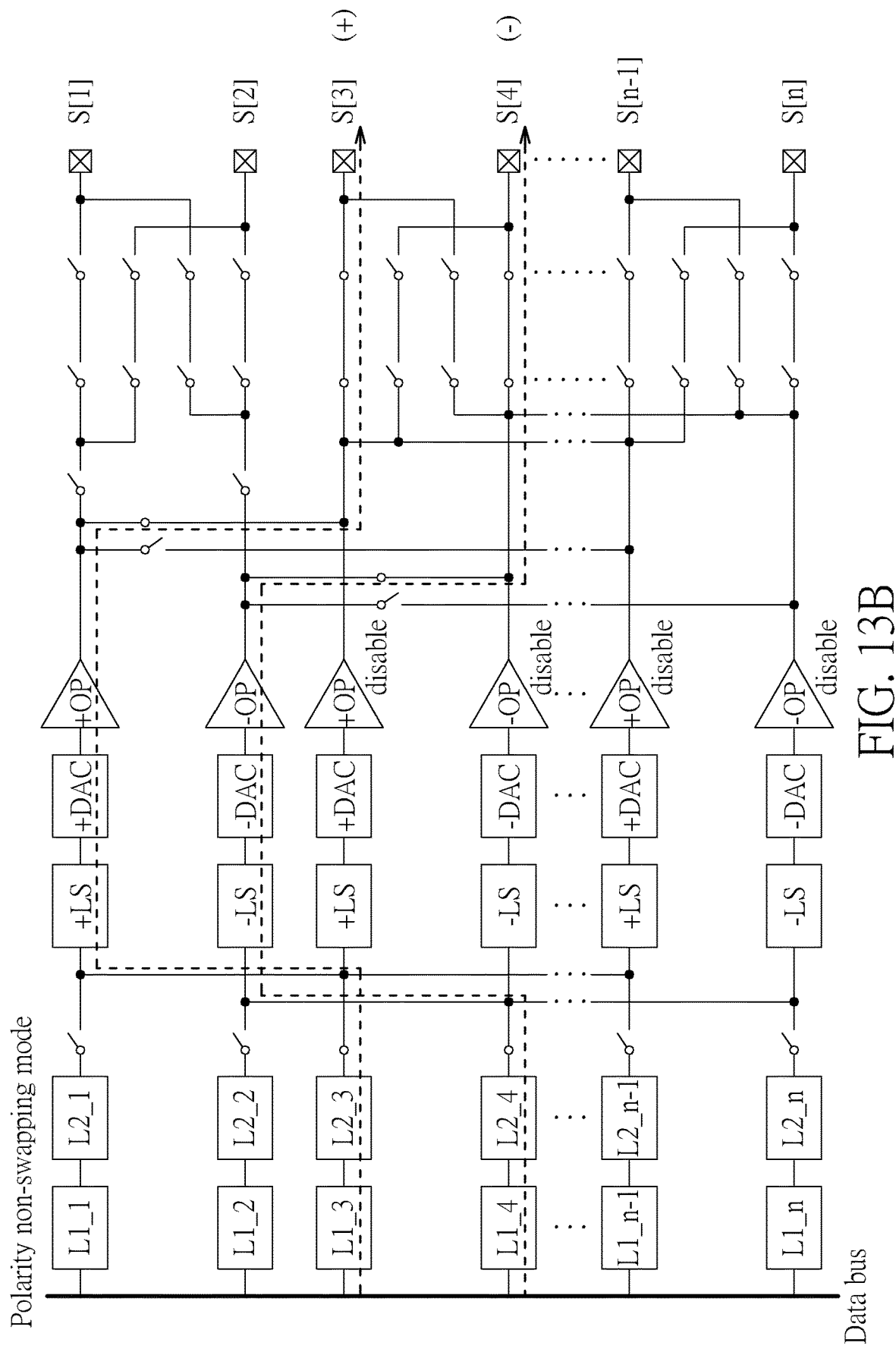
Figure 13C:
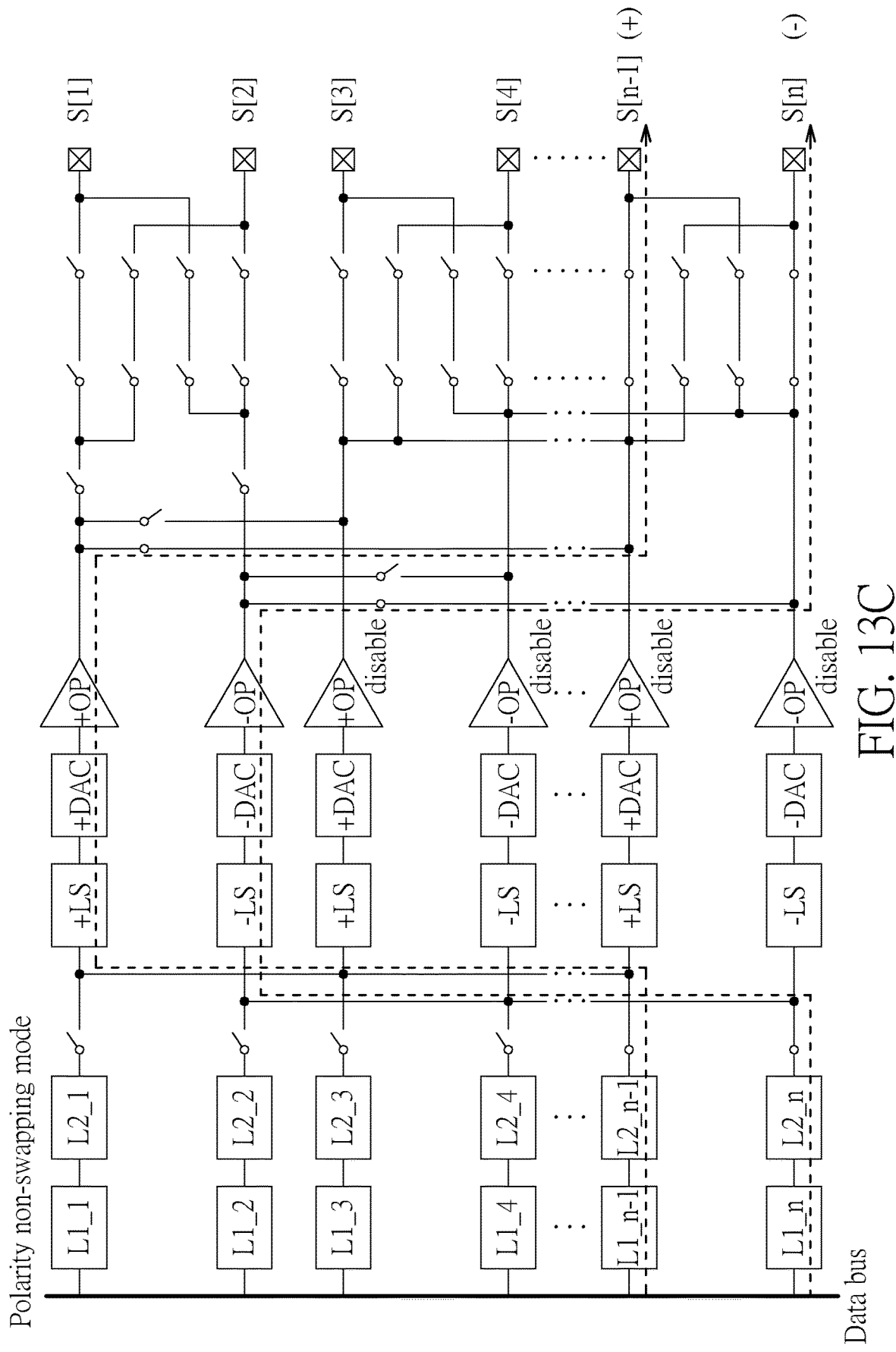
Figure 13D:
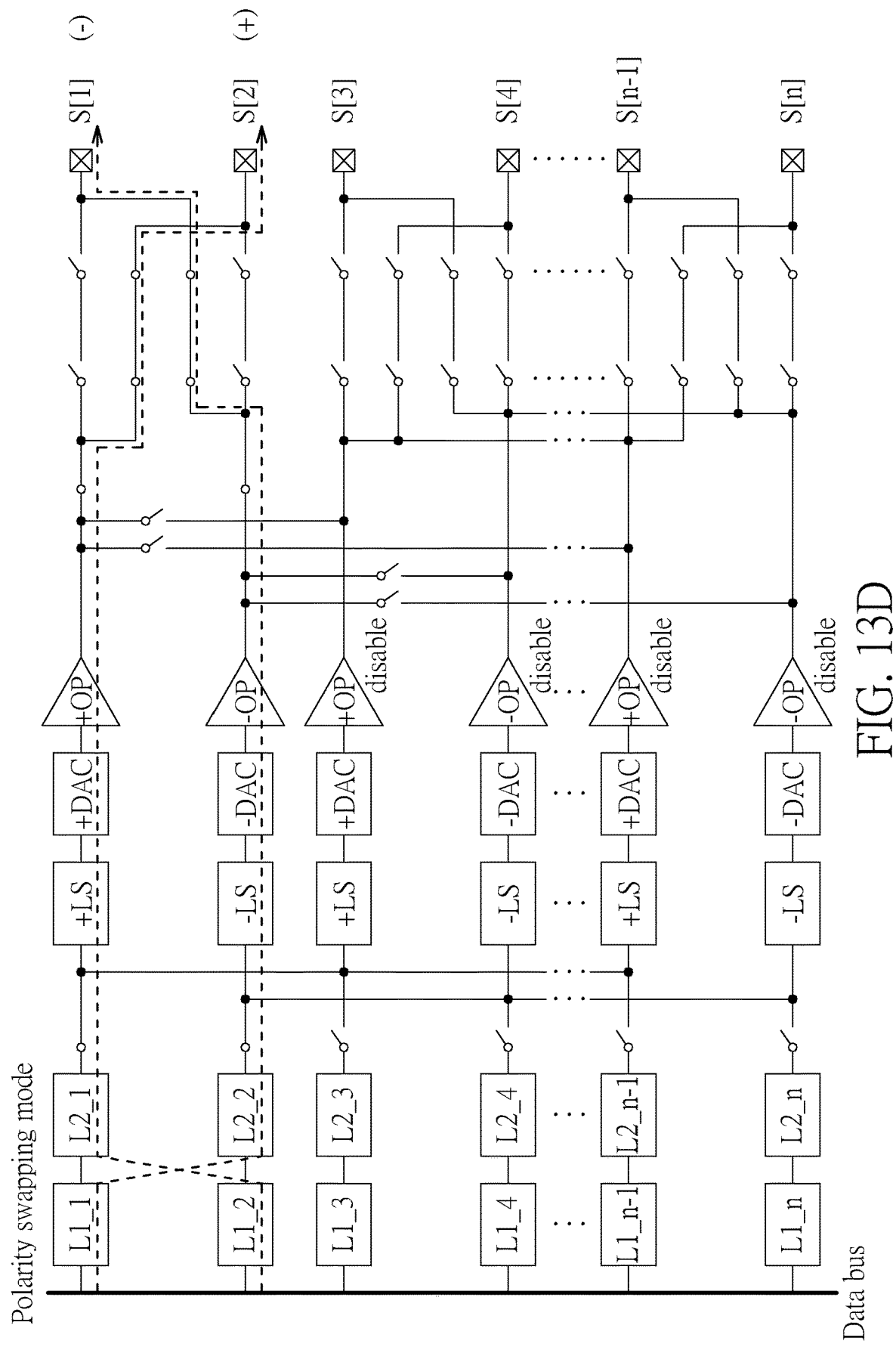
Figure 13E:
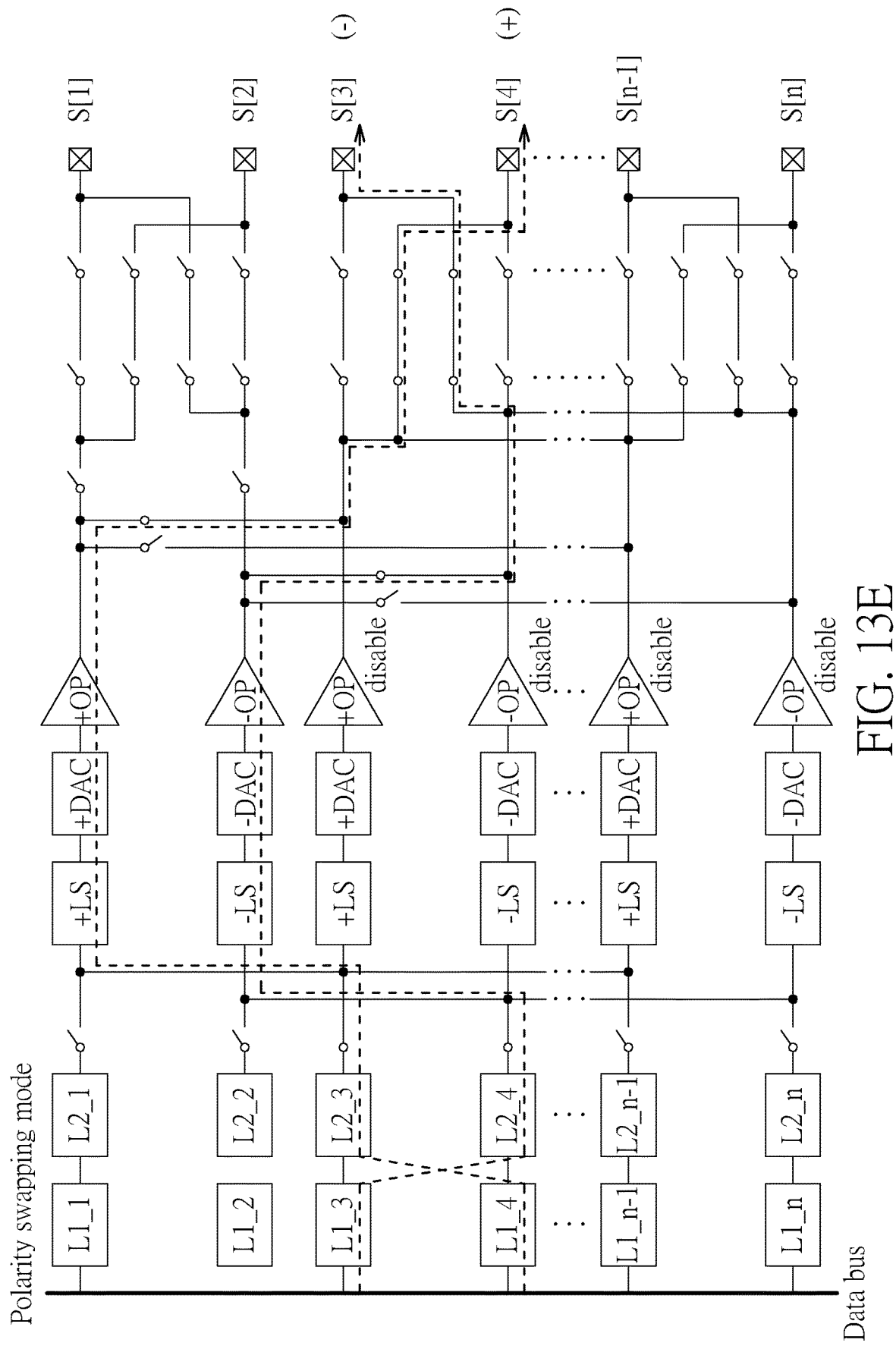
Figure 13F:
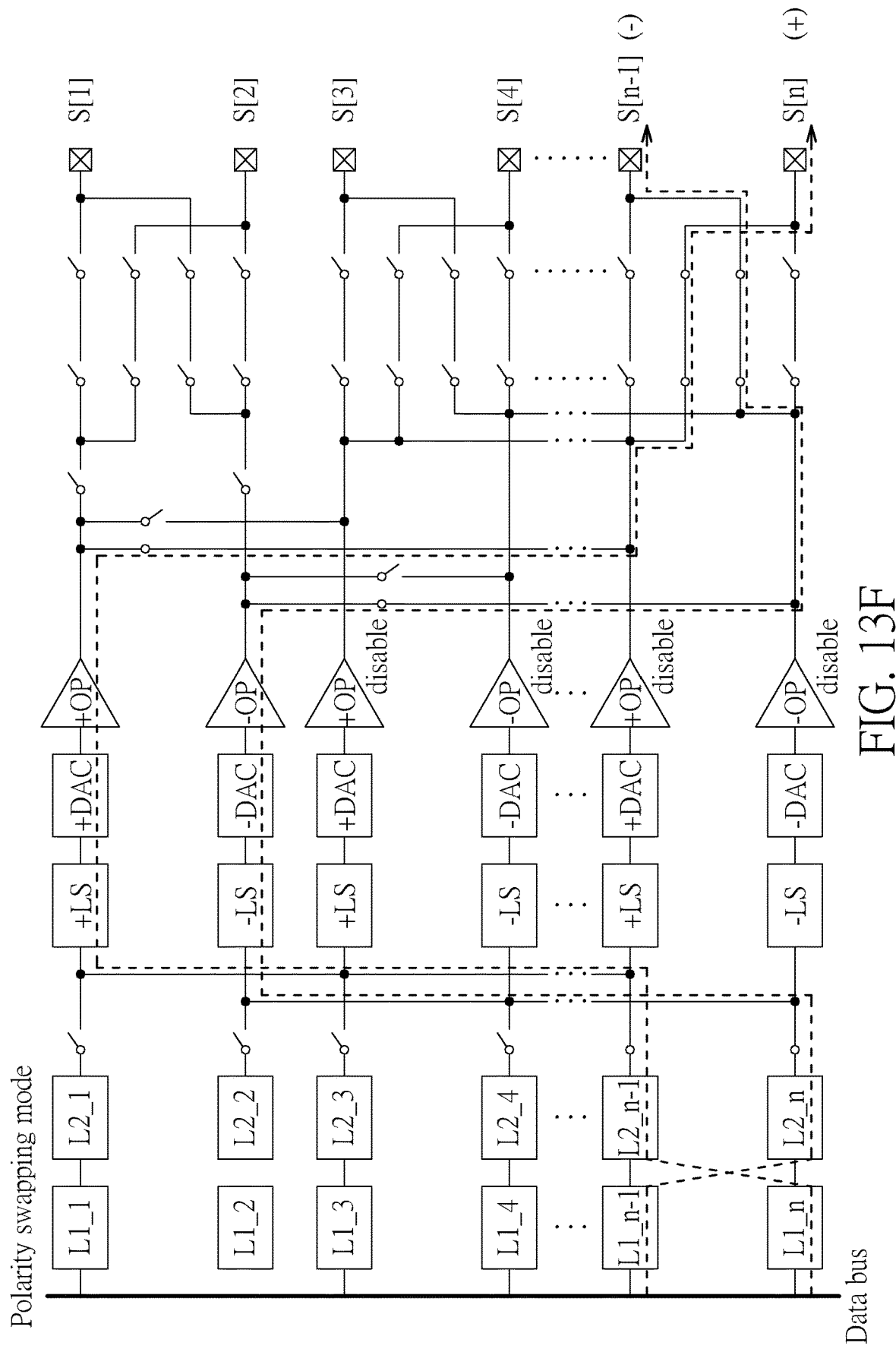

In the power saving mode, the first output buffer group 1110 outputs image data to the output nodes S[1]-S[n], while the second output buffer group 1120 is disabled. In such a situation, the OPs in the output buffer group 1110 may output image data to the output nodes S[1] and S[2], the output nodes S[3] and S[4], . . . , and the output nodes S[n−1] and S[n] in different data cycles. The disabled second output buffer group 1120 may reduce the power consumption of the source driver 1100 in the power saving mode. In an embodiment, when an OP is disabled, the level shifter and the DAC in the corresponding channel may also be disabled. FIGS. 13A-13F illustrate the operations of the MUX and related data flows of the source driver 1100 in the power saving mode, where the OPs in the first output buffer group 1110 are enabled and the OPs in the second output buffer group 1120 are disabled. FIGS. 13A-13C illustrate the data flows in the polarity non-swapping mode in different data cycles, and FIGS. 13D-13F illustrate the data flows in the polarity swapping mode in different data cycles. In these embodiments, the switches in the MUX and the switches in the input channels may be well controlled in order to output correct image data from the selected input channels. Those skilled in the art should understand the detailed operations of the embodiments by referring to the illustrations of FIGS. 13A-13F and related descriptions in the above paragraphs.

The structure of the source driver 1100 allows the operations of the normal mode and the power saving mode, which may be controlled by the timing controller using a control signal, and/or determined by an image pattern. In an embodiment, when the source driver 1100 receives the control signal from the timing controller, the source driver 1100 may know that it should operate in the normal mode or the power saving mode for the upcoming image frame, and correspondingly control the configurations of the MUX and related switches.

In another embodiment, the source driver 1100 may determine whether to operate in the normal mode or the power saving mode based on the received image data (rather than receiving a control signal from the timing controller). For example, when the difference of two consecutive image data to be outputted to the same data line is greater than a threshold, the source driver 1100 may operate in the normal mode where every output buffer is enabled. When the difference of two consecutive image data to be outputted to the same data line is less than the threshold, the source driver 1100 may operate in the power saving mode where several output buffers are disabled and several output buffers are configured to drive multiple data lines.

If the difference of two consecutive image data for the same data line is smaller, the required charging capability and charging time may be smaller. In such a situation, an OP may have enough time to charge more than one data line during a turned-on cycle of a gate line; that is, the charging time for one data line may only occupy a part of the turned-on cycle of the gate line. Therefore, it is preferable to operate in the power saving mode when the difference of data lines is smaller. On the other hand, if the difference of two consecutive image data for the same data line is larger, the required charging capability and charging time may be larger. In such a situation, the source driver 1100 may preferably operate in the normal mode, allowing the OP to have enough charging time for charging the data line.

Figure 14:
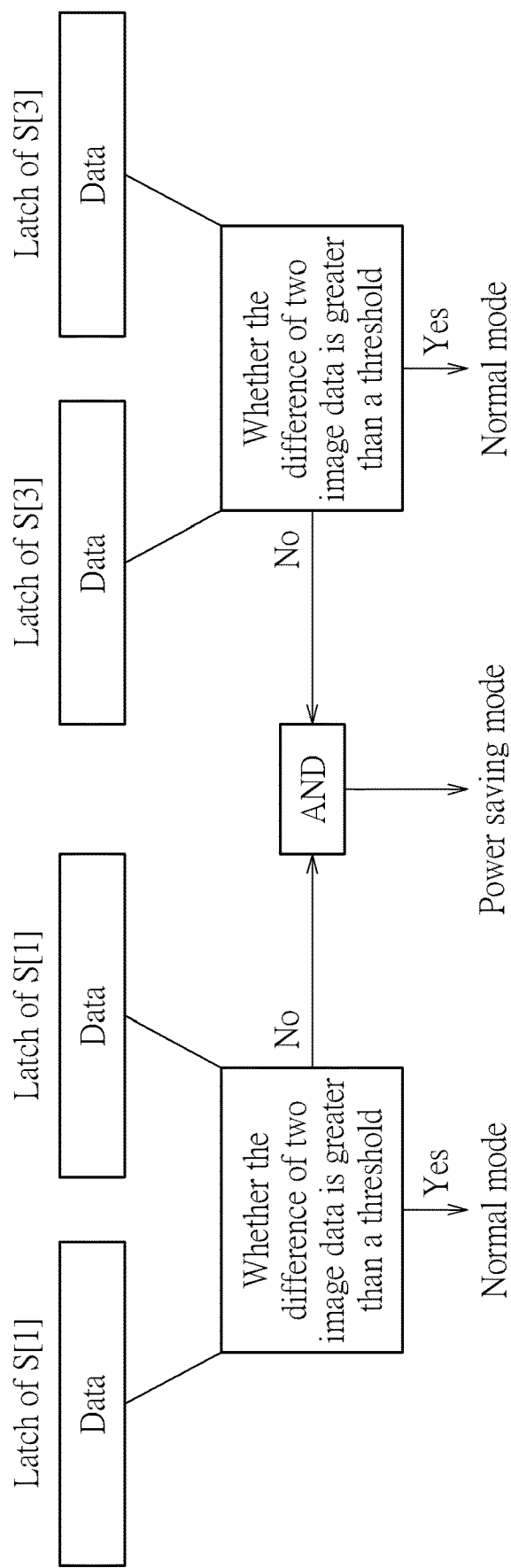
FIG. 14 is a schematic diagram of determination of the operation mode for the source driver.

Since an OP may be configured to drive more than two data lines in the power saving mode, the comparison results of difference of image data on at least two data lines may be considered and combined to determine whether the power saving mode should be performed. Please refer to FIG. 14, which is a schematic diagram of determination of the operation mode for the source driver. In detail, two consecutive image data of the output node S[1] are compared, to determine whether the difference of these two image data is greater than a threshold. If the difference is greater than the threshold, the normal mode may be performed; otherwise, a signal is sent to an AND module. Another two consecutive image data of the output node S[3] are compared, to determine whether the difference of these two image data is greater than a threshold. If the difference is greater than the threshold, the normal mode may be performed; otherwise, a signal is sent to the AND module. If both signals received by the AND module indicate that the difference of image data is less than the threshold, the AND module may output a signal to indicate that the source driver can operate in the power saving mode. In such a situation, the OP corresponding to the output node S[1] may output image data to the output node S[1] and also output image data to the output node S[3] in different data cycles, and the OP corresponding to the output node S[3] may be disabled, so as to reduce power consumption. In an embodiment, each input channel may include an additional data latch for storing the image data to be compared before the image data are forwarded to the selected output buffer based on the determined operation mode.

Figure 15:
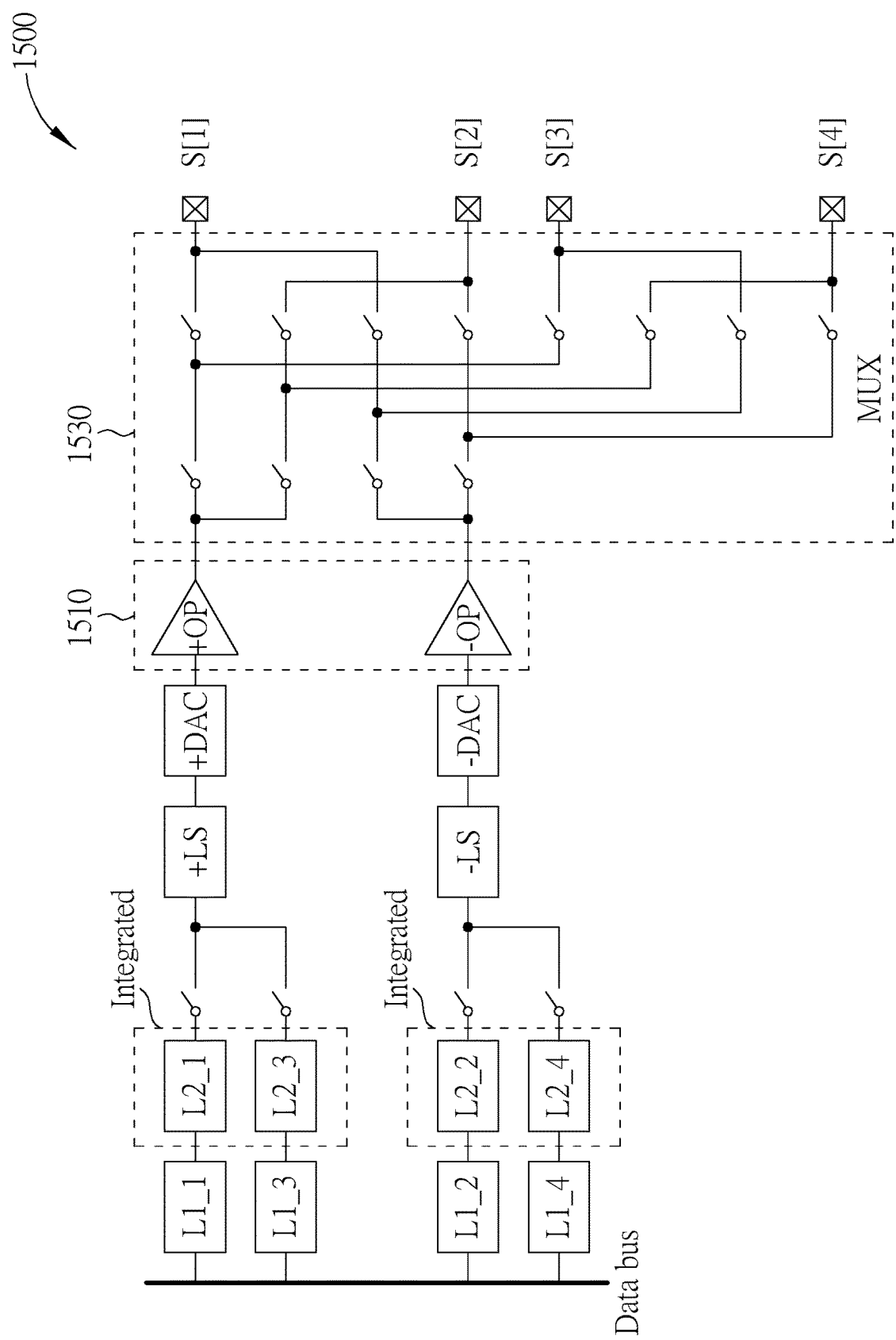
FIG. 15 is a schematic diagram of another source driver according to an embodiment of the present invention.
Figure 16A:
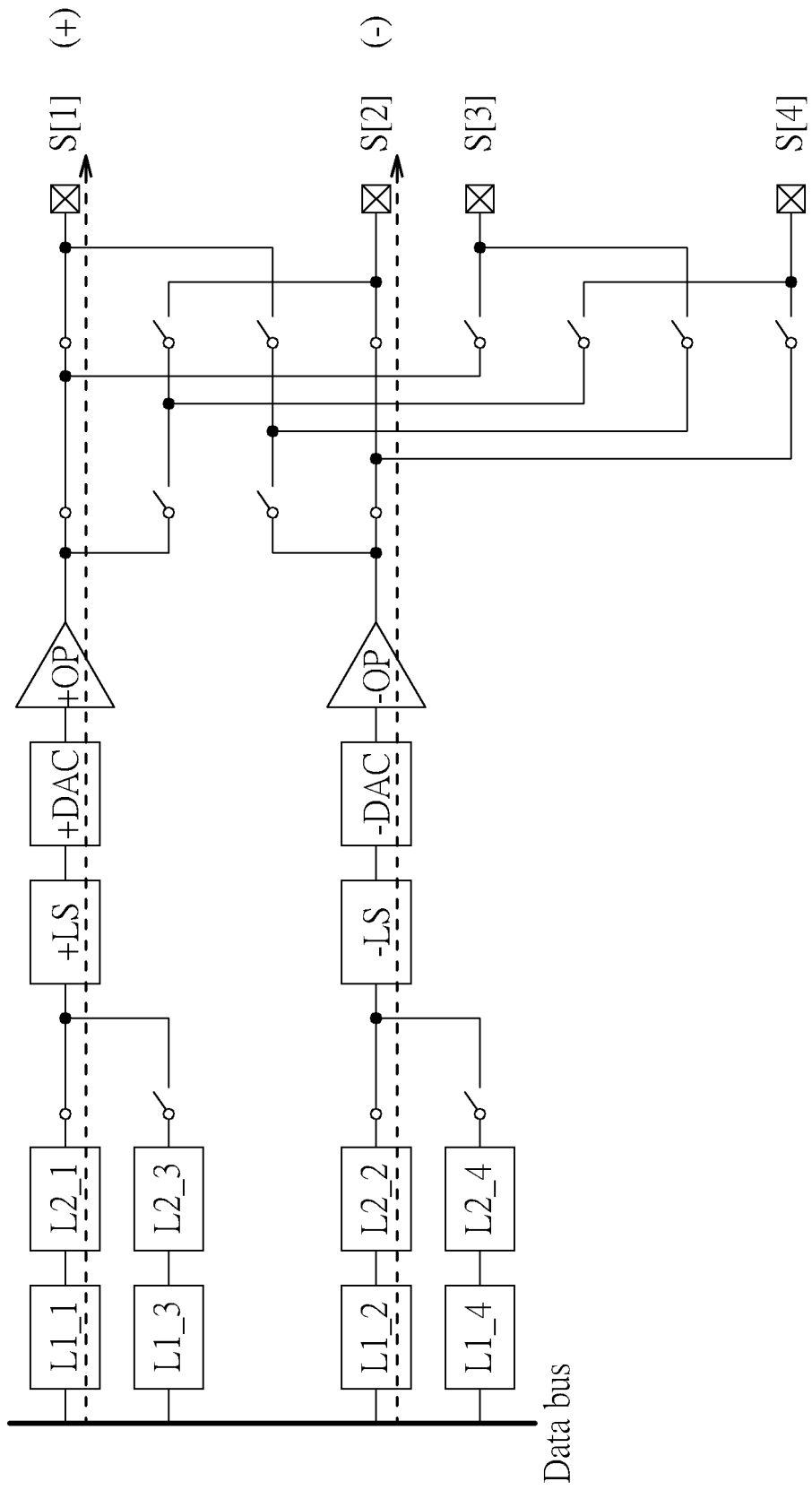
FIGS. 16A-16D are schematic diagrams of the detailed operations and related data flows of the source driver shown in FIG. 15.
Figure 16B:
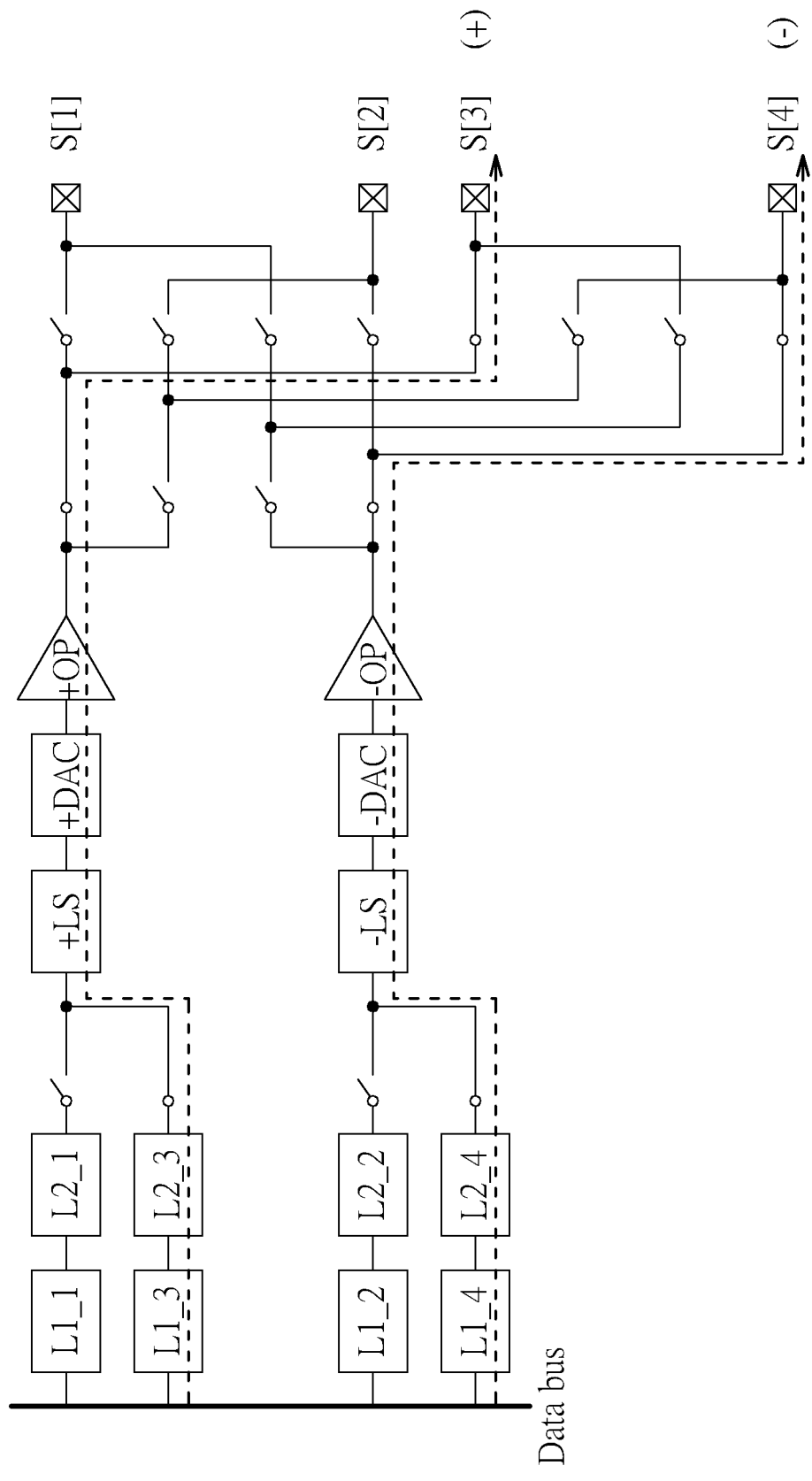
Figure 16C:
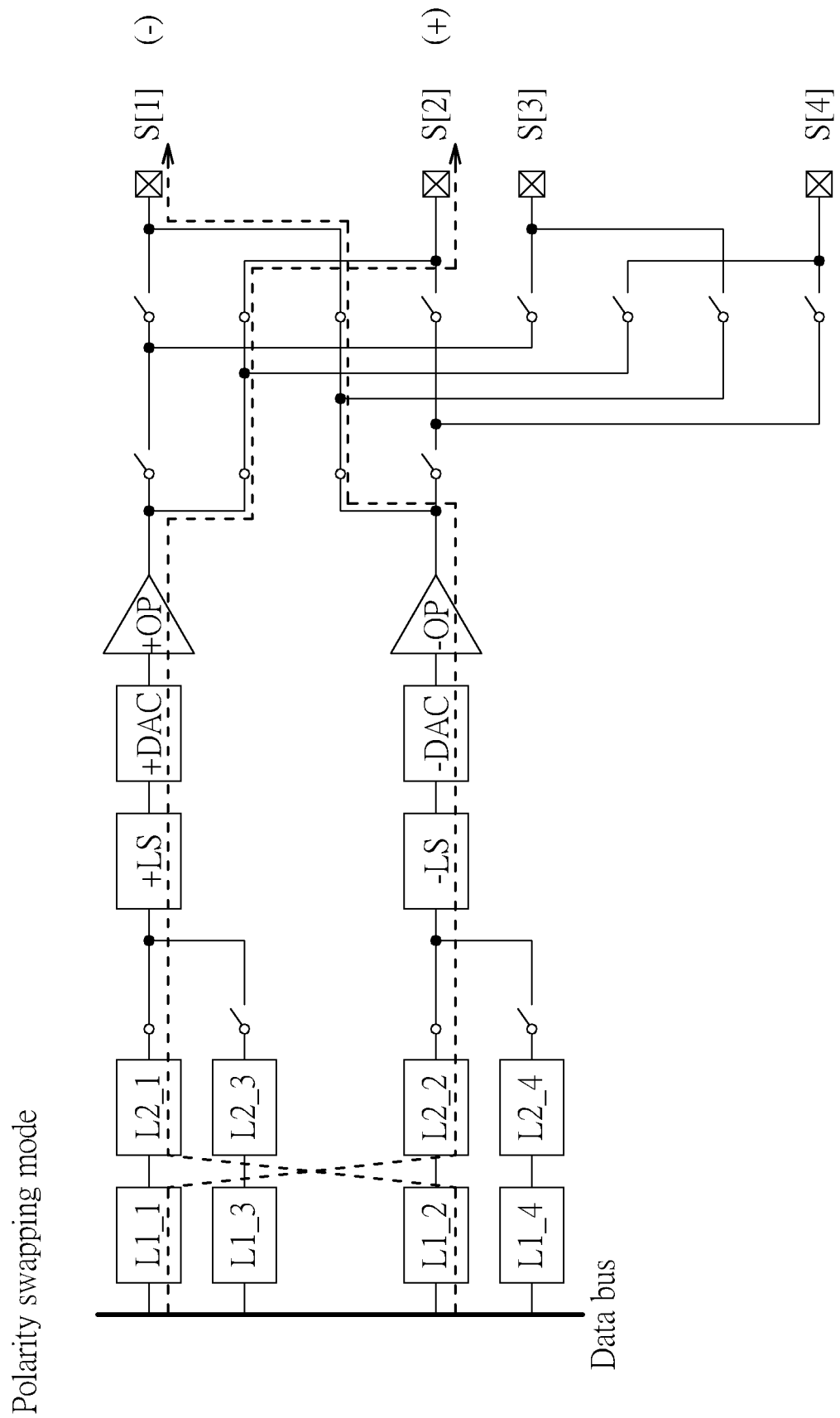
Figure 16D:
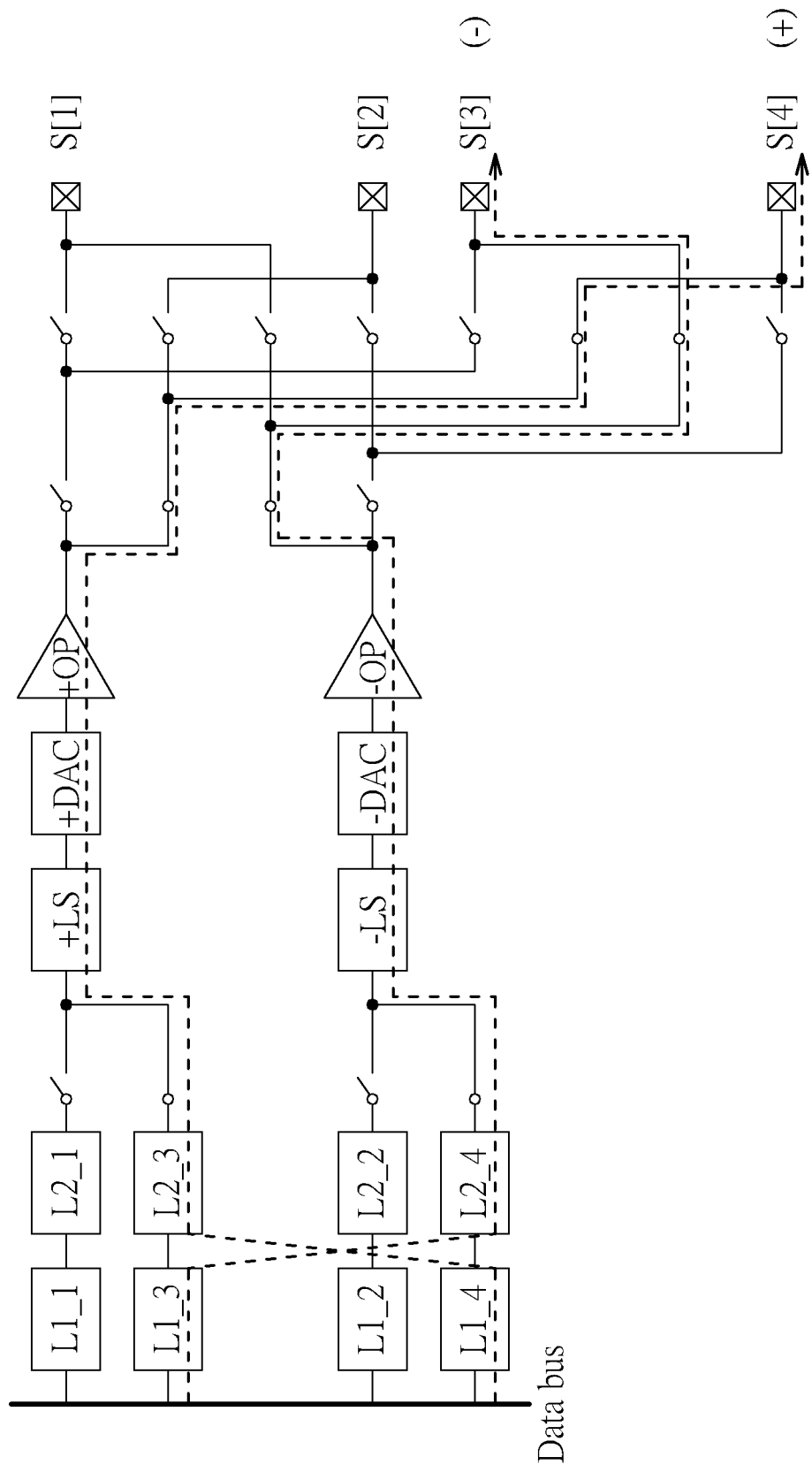

Please refer to FIG. 15, which is a schematic diagram of another source driver 1500 according to an embodiment of the present invention. As shown in FIG. 15, the source driver 1500 includes an output circuit, which includes an output buffer group 1510, a MUX 1530, and output nodes S[1]-S[4]. Each OP in the output buffer group 1510 is coupled to an input channel having data latches, level shifters and DACs. The output buffer group 1510 includes two OPs, i.e., an OP with positive polarity (+OP) and an OP with negative polarity (−OP), which are configured to output image data to four output nodes S[1]-S[4]. In this embodiment, each output node has a corresponding set of data latches, and thus each OP is selectively coupled to one of two sets of data latches. The image data to be outputted to an output node may be received from the corresponding set of data latches. For example, the OP may receive a first image data from the data latches L1_1 and L2_1 and output the first image data to the output node S[1] in a first data cycle, and receive a second image data from the data latches L1_3 and L2_3 and output the second image data to the output node S[3] in a second data cycle. The detailed operations and related data flows of the source driver 1500 in the polarity non-swapping mode and the polarity swapping mode are illustrated in FIGS. 16A-16D. Those skilled in the art should understand the related operations by referring to the illustrations of FIGS. 16A-16D and the descriptions in the above paragraphs.

In an embodiment, the second data latches L2_1 and L2_3 may be integrated as a single data latch, and/or the second data latches L2_2 and L2_4 may be integrated as a single data latch.

To achieve the purpose of power saving, several unnecessary OPs or output buffers may be omitted or disabled, while the input channels may be implemented in any proper manners, as those shown in FIG. 15 or FIG. 11. In the source driver, the image data may be forwarded through the data latches, the output buffer(s), the MUX and the output nodes in a proper way based on the circuit structure. As long as there is an output buffer capable of driving multiple data lines and/or an output buffer group having a specific number of output buffers is capable of outputting image data to more number of output nodes, the driving method should belong to the scope of the present invention.

Please note that the present invention aims at reducing the number of output buffers in the output circuit of the source driver, in order to reduce static power consumption of the source driver. With the reduced number of output buffers in the output circuit, each of the remaining output buffers is required to output image data to multiple output nodes and drive multiple data lines. Therefore, a MUX is disposed between the output nodes and the output buffers. With well control of the MUX, each output buffer may be coupled to a selected output node in each data cycle, and may be coupled to different output nodes in different data cycles with different MUX configurations. Preferably, the output nodes may be the output pins of a chip, and the MUX and the output buffers are implemented in the same chip. In such a situation, the MUX and the output buffers may operate in the same voltage domain. This implementation is different from another type of circuit where the MUX is implemented on the glass substrate of the panel. If the MUX is implemented on the glass substrate, the switches of the MUX should be controlled by high voltage signals, and thus an additional level shifter for generating high voltage signals is required. Also, the circuit characteristics on the glass substrate may be worse than the circuit characteristics of the chip, since the traces in the chip may have less parasitic capacitance/resistance and the performance of the circuit elements (used for realizing the switches) in the chip is better than the performance of the circuit elements on the glass substrate. For example, the switches in the chip may be turned on or off more rapidly than the switches on the glass substrate. Moreover, in comparison with the conventional structure of the display system, the present invention only requires to modify the structure of the source driver by inserting a MUX into the output circuit. This novel source driver is applicable to any type of panels or the panels in any process, and no additional modification or adjustment is required for the structure of the panel.

To sum up, the present invention provides an output circuit of a source driver having a reduced number of output buffers, in order to reduce the static power consumption of the source driver. A MUX, which may include a plurality of switches, is disposed between the output nodes and the output buffers, allowing one output buffer to be able to output image data to multiple output nodes and thereby drive multiple data lines. If each output buffer is able to drive n data lines on the panel no matter whether polarity inversion is performed, the total number of output buffers in the output circuit may be divided by n. Therefore, the circuit area may be reduced, and the static power consumption may be reduced correspondingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output circuit of a driver, configured to drive a panel through a plurality of data lines, the output circuit comprising:
a plurality of output buffers, configured to output data to the plurality of data lines, wherein each of the plurality of output buffers is configured to output data to at least two data lines among the plurality of data lines; and
a multiplexer, configured to be coupled between a second number of the plurality of data lines and a first number of the plurality of output buffers, configured to selectively couple each of the first number of the plurality of output buffers to one of the second number of the plurality of data lines at a time, wherein the first number is less than the second number;
wherein the multiplexer comprises a plurality of switches, each coupled between the plurality of output buffers and one of the plurality of data lines, and the plurality of switches comprise a plurality of polarity swapping switches and a plurality of selection switches.

2. The output circuit of claim 1, wherein the plurality of output buffers comprise:
a first output buffer, configured to output data in a first polarity; and
a second output buffer, configured to output data in a second polarity.

3. The output circuit of claim 2, wherein the first output buffer is coupled to a first data line among the plurality of data lines and the second output buffer is coupled to a second data line among the plurality of data lines in a polarity non-swapping mode, and the first output buffer is coupled to the second data line and the second output buffer is coupled to the first data line in a polarity swapping mode.

4. The output circuit of claim 1, wherein the multiplexer and the plurality of output buffers operate in a same voltage domain.

5. The output circuit of claim 1, wherein the multiplexer and the plurality of output buffers are implemented in a same chip, and the plurality of data lines are coupled to a plurality of output pins of the chip.

6. The output circuit of claim 1, wherein each of the plurality of polarity swapping switches is integrated with one of the plurality of selection switches.

7. The output circuit of claim 1, wherein each of the plurality of output buffers is coupled to a plurality of data latches.

8. The output circuit of claim 7, wherein a first output buffer among the plurality of output buffers is configured to receive a first data from a first data latch among the plurality of data latches and output the first data to a first data line among the plurality of data lines in a first data cycle, and configured to receive a second data from a second data latch among the plurality of data latches and output the second data to a second data line among the plurality of data lines in a second data cycle.

\* \* \* \* \*